United States Patent
Jang

(10) Patent No.: US 10,679,564 B2
(45) Date of Patent: Jun. 9, 2020

(54) SHIFT REGISTER AND DISPLAY APPARATUS INCLUDING THE SAME

(71) Applicant: LG Display Co., Ltd., Seoul (KR)

(72) Inventor: YongHo Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/005,384

(22) Filed: Jun. 11, 2018

(65) Prior Publication Data

US 2018/0366067 A1    Dec. 20, 2018

(30) Foreign Application Priority Data

Jun. 15, 2017  (KR) .................... 10-2017-0075724

(51) Int. Cl.
| | |
|---|---|
| *G11C 19/00* | (2006.01) |
| *G09G 3/3266* | (2016.01) |
| *G09G 3/36* | (2006.01) |
| *G11C 19/28* | (2006.01) |

(52) U.S. Cl.
CPC ......... *G09G 3/3266* (2013.01); *G09G 3/3677* (2013.01); *G11C 19/28* (2013.01); *G09G 2310/0286* (2013.01); *G09G 2310/0289* (2013.01); *G09G 2310/06* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 8,422,621 | B2* | 4/2013 | Jang | G09G 3/3677 377/64 |
| 10,074,329 | B2* | 9/2018 | Jang | G09G 3/3677 |
| 2004/0140839 | A1* | 7/2004 | Nagao | G11C 19/00 327/291 |
| 2007/0274433 | A1* | 11/2007 | Tobita | G09G 3/3677 377/64 |
| 2008/0002805 | A1* | 1/2008 | Tobita | G11C 19/184 377/64 |
| 2008/0219401 | A1* | 9/2008 | Tobita | G09G 3/3677 377/79 |
| 2013/0253976 | A1* | 9/2013 | Shukla | G06Q 10/107 705/7.26 |
| 2014/0354655 | A1* | 12/2014 | Kim | G06T 1/20 345/501 |

(Continued)

FOREIGN PATENT DOCUMENTS

| | | |
|---|---|---|
| KR | 10-0847092 B1 | 7/2008 |
| KR | 10-2014-0014836 A | 2/2014 |

(Continued)

*Primary Examiner* — Tuan T Lam
(74) *Attorney, Agent, or Firm* — Polsinelli PC

(57) ABSTRACT

Disclosed are a shift register and a display apparatus including the same, which stably output signals. The shift register may include a plurality of stages each including a first node controller controlling a voltage of a first node, based on first to third input signals and a transistor offset voltage. The first node controller may include a connection node supplied with at least one of the transistor offset voltage and the second input signal and preliminarily charged with the transistor offset voltage according to the third input signal.

25 Claims, 12 Drawing Sheets

(56) References Cited

U.S. PATENT DOCUMENTS

| | | | |
|---|---|---|---|
| 2015/0116194 A1* | 4/2015 | Matsui | G09G 3/3266 |
| | | | 345/100 |
| 2015/0317954 A1* | 11/2015 | Jang | G09G 3/20 |
| | | | 345/213 |
| 2016/0253976 A1 | 9/2016 | Jang et al. | |
| 2016/0267854 A1* | 9/2016 | Kim | G09G 3/3466 |
| 2018/0190231 A1* | 7/2018 | Shi | G09G 3/3655 |
| 2018/0211626 A1* | 7/2018 | Shi | G09G 3/3677 |
| 2018/0211627 A1* | 7/2018 | Shi | G09G 3/3677 |
| 2018/0218698 A1* | 8/2018 | Li | G09G 3/3674 |
| 2018/0357974 A1* | 12/2018 | Zheng | G11C 19/28 |

FOREIGN PATENT DOCUMENTS

| | | |
|---|---|---|
| KR | 10-2015-0028403 A | 3/2015 |
| KR | 10-2015-0126286 A | 11/2015 |
| KR | 10-2016-0016956 A | 2/2016 |

\* cited by examiner

SHIFT REGISTER AND DISPLAY APPARATUS INCLUDING THE SAME

CROSS-REFERENCE TO RELATED APPLICATION

This application claims the benefit of the Korean Patent Application No. 10-2017-0075724 filed on Jun. 15, 2017, which is hereby incorporated by reference in its entirety as if fully set forth herein.

BACKGROUND

Field of the Disclosure

The present disclosure relates to a display device, and more particularly, to a shift register and a display apparatus including the same. Although the present disclosure is suitable for a wide scope of applications, it is particularly suitable for providing a shift register capable of stably outputting signals and a display apparatus including the same.

Description of the Background

Recently, with the advancement of multimedia, the importance of display apparatuses is increasing. Therefore, flat panel display apparatuses such as liquid crystal display (LCD) apparatuses, organic light emitting display apparatuses, and light emitting diode display apparatuses are being applied in various areas. The LCD apparatuses and the organic light emitting display apparatuses among the flat panel display apparatuses have good characteristics such as thinness, lightness, and low power consumption, and thus, are being widely used as a display screen for televisions (TVs), notebook computers, and monitors as well as portable electronic devices such as electronic notebooks, e-books, portable multimedia players (PMPs), navigation devices, ultra-mobile personal computers (PCs), mobile phones, smartphones, smartwatches, tablet personal computers (PCs), watch phones, and mobile communication terminals.

The LCD apparatuses and the organic light emitting display apparatuses each include a display panel that includes a plurality of data lines, a plurality of scan lines, and a plurality of pixels connected to a corresponding data line and a corresponding gate line, a data driving circuit that supplies data signals to the data lines, and a scan driving circuit including a shift register that supplies a scan pulse to the scan lines.

Each of the plurality of pixels is supplied with a data signal through a corresponding data line from the data driving circuit in synchronization with the scan pulse supplied through a corresponding scan line from the scan driving circuit and displays an image corresponding to the data signal.

FIG. 1 is a circuit diagram schematically illustrating one stage in the related art shift register.

Referring to FIG. 1, the related art stage includes a charging unit 10, a reset unit 30, an inverter unit 50, and an output unit 70.

The charging unit 10 includes 1-1st to 1-3rd transistors T11 to T13 for charging a voltage into a first node Q, based on a start signal VST.

The 1-1st and 1-2nd transistors T11 and T12 are serially connected to a first node Q. The 1-1st and 1-2nd transistors T11 and T12 are simultaneously turned on according to the start signal VST and charges the start signal VST into the first node Q.

The 1-3rd transistor T13 is turned on based on a voltage of the first node Q and supplies a transistor offset voltage Vd to a connection node Nc between the 1-1st transistor T11 and the 1-2nd transistor T12.

The reset unit 30 includes a second transistor T2 which is turned on according to a reset signal RST and resets the voltage of the first node Q to a voltage level of a first low level power source VSS1.

The inverter unit 50 is connected between the first node Q and a second low level power source VSS2. The inverter unit 50 controls a voltage of a second node QB to a voltage opposite to the voltage of the first node Q, based on the voltage of the first node Q.

The output unit 70 includes a pull-up transistor Tu, which outputs a clock signal CLK as a high level voltage of a scan signal SS according to the voltage of the first node Q, and a pull-down transistor Td which outputs a voltage level of a third low level voltage VSS3 as a low level voltage of the scan signal SS according to the voltage of the second node QB.

In the stage, a variation of the voltage of the first node Q caused by the start signal VST will be described below.

First, during a high period (or a high level period) of the start signal VST, the first node Q is charged with a high level voltage of the start signal VST supplied through the 1-1st transistor T11 and the 1-2nd transistor T12. At this time, the connection node Nc is charged with a voltage corresponding to a difference voltage between a gate voltage and a threshold voltage of the 1-1st transistor T11 which operates in a saturation region, and the voltage of the first node Q is set to a voltage lower than a voltage of the connection node Nc, based on an influence of the threshold voltage of the 1-1st transistor T11. For example, when the threshold voltage of the 1-1st transistor T11 is 5 V, both the transistor offset voltage Vd and the high level voltage of the start signal VST are 25 V, and the high period of the start signal VST is very short, the voltage of the connection node Nc may be set to 18 V (theoretically 20 V), and the voltage of the first node Q may be limited to 18 V by the voltage of the connection node Nc.

Subsequently, if the start signal VST is changed to a low period (or a low level period), the 1-2nd transistor T12 is turned off by the low level voltage of the start signal VST. At this time, the 1-3rd transistor T13 is turned on based on the voltage of the first node Q and supplies the transistor offset voltage Vd to the connection node Nc. Therefore, the 1-2nd transistor T12 turned off by the low level voltage of the start signal VST is put in a complete off state because a gate voltage of the 1-2nd transistor T12 is relatively lower than the voltage of each of the first node Q and the connection node Nc, thereby preventing the voltage of the first node Q from being leaked.

In the stage, since the voltage of the first node Q is prevented from being leaked, the scan signal can be more stably output.

However, the voltage of the first node Q provided in the stage is limited by the voltage of the connection node Nc provided in the charging unit 10, and the voltage of the connection node Nc is limited by the threshold voltage of the 1-1st transistor T11 provided in the charging unit 10. Therefore, if the threshold voltage of the 1-1st transistor T11 is high, a charging voltage of the first node Q is lowered, and due to this, an output characteristic of the scan signal is reduced, whereby the scan signal cannot stably be output.

Therefore, in the related art shift register, if the threshold voltage of the 1-1st transistor T11 provided in the charging unit 10 of each stage increases, a voltage charging characteristic of the first node Q is reduced, and the output characteristic of the scan signal is inevitably reduced. For this reason, the scan signal cannot be stably output.

Moreover, in the related art shift register, the reset unit 30 of each stage includes 1-1st to 1-3rd transistors like the charging unit 10, and thus, by completely turning off the 1-2nd transistor turned off by the low level voltage of the reset signal RST, the voltage of the first node Q is additionally prevented from being leaked through the reset unit 30. In this case, however, in order to prevent the voltage of the first node Q from being leaked, due to the 1-3rd transistor added to each of the charging unit 10 and the reset unit 30 of each stage, the number of transistors of each stage increases, and a circuit is complicated.

SUMMARY

Accordingly, the present disclosure is directed to provide a shift register and a display apparatus including the same that substantially obviate one or more problems due to limitations and disadvantages of the related art.

An aspect of the present disclosure is directed to provide a shift register and a display apparatus including the same, which stably output signals.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a shift register including a plurality of stages each including a first node controller controlling a voltage of a first node, based on first to third input signals and a transistor offset voltage, wherein the first node controller may include a connection node supplied with at least one of the transistor offset voltage and the second input signal and preliminarily charged with the transistor offset voltage according to the third input signal.

In another aspect of the present disclosure, there is provided a shift register including a plurality of stages each including a first node controller controlling a voltage of a first node, wherein the first node controller may include a connection node and a pass transistor including a double gate structure and forming a current path between the connection node and the first node.

In another aspect of the present disclosure, there is provided a display apparatus including a scan driving circuit including a shift register for supplying a scan signal to each of a plurality of scan lines provided in a pixel array part including a plurality of pixels, wherein the shift register may include a plurality of stages each including a first node controller controlling a voltage of a first node, based on first to third input signals and a transistor offset voltage, and the first node controller may include a connection node supplied with at least one of the transistor offset voltage and the second input signal and preliminarily charged with the transistor offset voltage according to the third input signal.

In another aspect of the present disclosure, there is provided a display apparatus including a scan driving circuit including a shift register for supplying a scan signal to each of a plurality of scan lines provided in a pixel array part including a plurality of pixels, wherein the shift register may include a plurality of stages each including a first node controller controlling a voltage of a first node, and the first node controller may include a connection node and a pass transistor including a double gate structure and forming a current path between the connection node and the first node.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION

Figure 1:
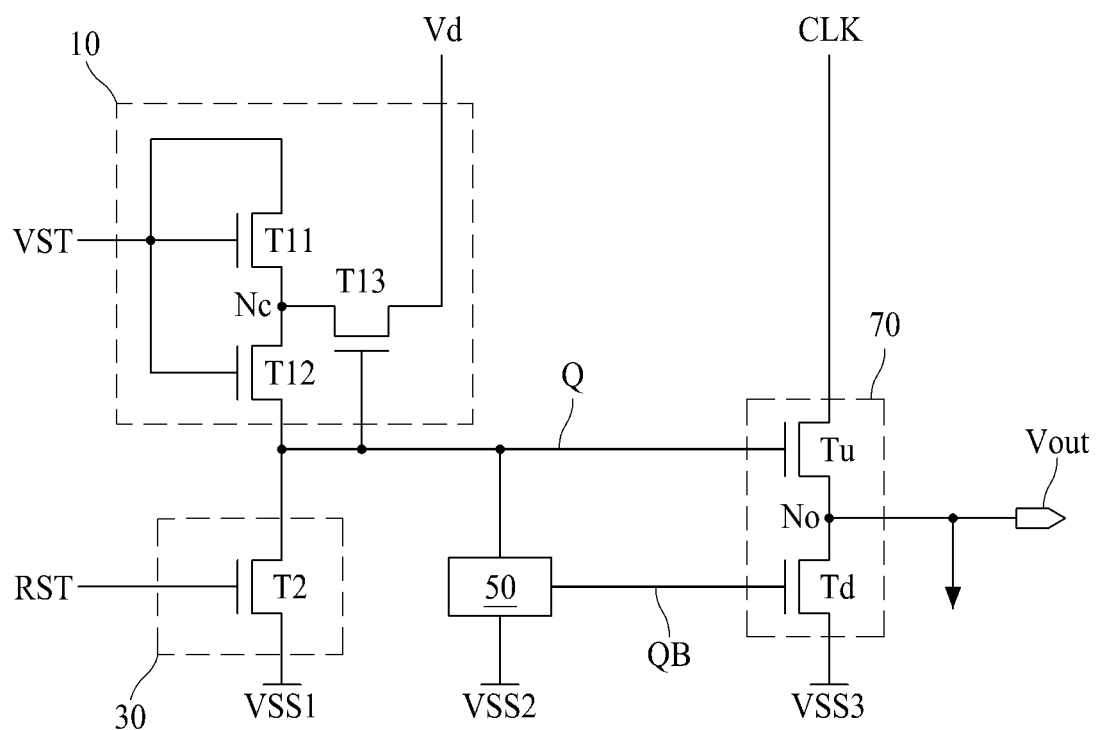
FIG. 1 is a circuit diagram schematically illustrating one stage in the related art shift register.

Reference will now be made in detail to the various exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~' and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, exemplary aspects of a shift register and a display apparatus including the same according to the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
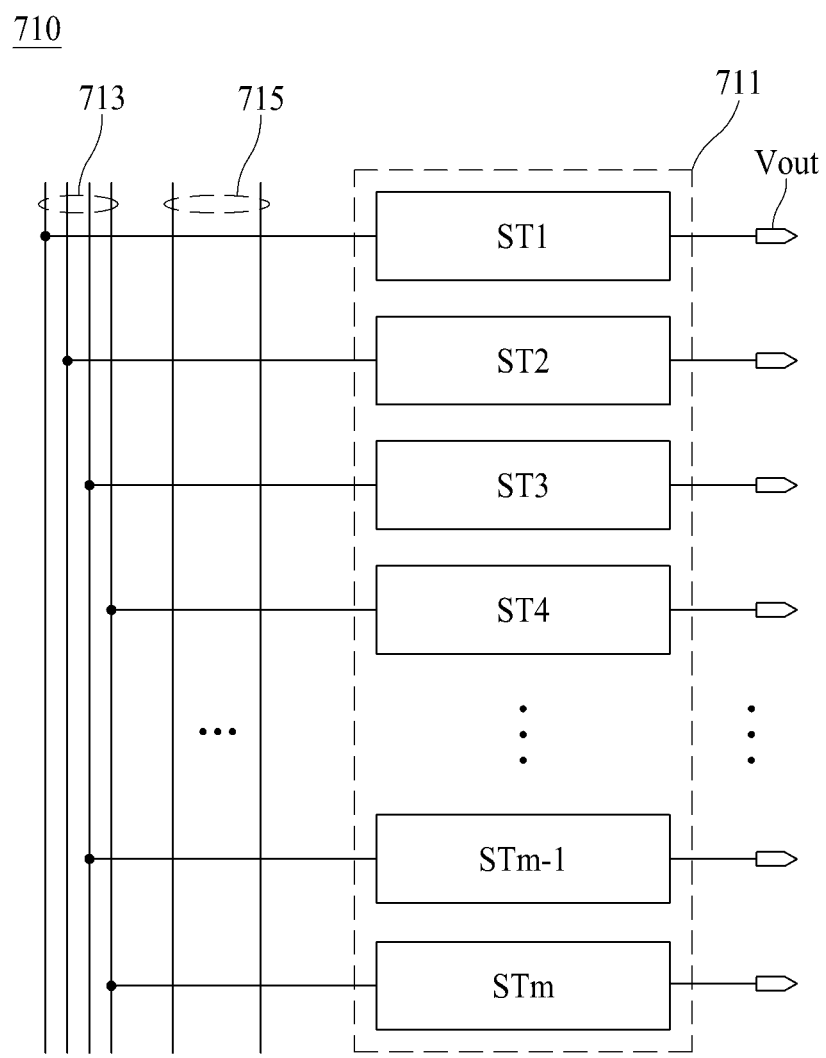
FIG. 2 is a diagram schematically illustrating a shift register according to an aspect of the present disclosure.

FIG. 2 is a diagram schematically illustrating a shift register 710 according to an aspect of the present disclosure.

Referring to FIG. 2, the shift register 710 according to an aspect of the present disclosure may include a stage circuit unit 711, a clock line part 713, and a power line part 715.

The stage circuit unit 711 may include a plurality of stages ST1 to STm respectively connected to a plurality of output terminals Vout.

Each of the plurality of stages ST1 to STm may be enabled in response to an output signal supplied from one of previous stages and may be reset in response to an output signal supplied from one of next stages. In this case, a first stage ST1 may be supplied with a start signal from the outside, instead of an output signal from one of previous stages. A last stage STm may be supplied with a reset signal from the outside, instead of an output signal from one of next stages. Optionally, the start signal may be sequentially supplied to first to third stages, and in this case, the reset signal may be sequentially supplied to nth to n−2nd stages. As a result, each of the start signal and the reset signal may be sequentially supplied to two or more stages based on a driving manner of the shift register.

The plurality of stages ST1 to STm according to an aspect of the disclosure may each include a plurality of transistors. Here, the plurality of transistors may each include an oxide semiconductor layer such as zinc oxide (ZnO), indium zinc oxide (InZnO), indium gallium zinc oxide (InGaZnO$_4$), or the like, but without being limited thereto, the plurality of transistors may each include silicon or an organic material in addition to the oxide semiconductor layer. Also, the plurality of transistors may each be a thin film transistor (TFT).

The clock line part 713 may include a plurality of clock signal lines which are supplied with a plurality of clock signals having sequentially delayed phases from an external control circuit or a clock generator. The plurality of clock signal lines may be selectively connected to each of the plurality of stages ST1 to STm and may supply at least one clock signal to each of the plurality of stages ST1 to STm, so as to match the driving manner of the shift register.

The clock line part 713 according to an aspect of the disclosure may include a plurality of scan clock signal lines which respectively receive a plurality of scan clock signals supplied from the external control circuit or the clock generator.

Each of the plurality of scan clock signals may include a first period and a second period which are repeated at certain intervals. Here, the first period may have a voltage level for turning on a transistor, and the second period may have a voltage level for turning off the transistor. The first periods of the plurality of scan clock signals may be sequentially shifted, and at least some of adjacent scan clock signals may overlap. For example, the first period of each of the plurality of scan clock signals may be shifted by units of one horizontal period of a display panel, but may be variously set without being limited thereto. Also, first periods of adjacent scan clock signals may overlap by one-third (⅓) thereof, but may overlap by half (½) to one-fourth (¼) thereof without being limited thereto.

The clock line part 713 according to an aspect of the disclosure may further include a plurality of carry clock signal lines which respectively receive a plurality of carry clock signals supplied from the external control circuit or the clock generator.

Each of the plurality of carry clock signals according to an aspect of the disclosure may have the same phase as that of each of the plurality of scan clock signals.

Each of the plurality of carry clock signals according to an aspect of the disclosure may overlap the first period of a corresponding scan clock signal of the plurality of scan clock signals in a one-to-one relationship, and a duration of the first period may be longer than a first period of an overlapping scan clock signal.

The power line part 715 may supply various powers, which are necessary for selectively outputting the scan clock signal and a gate-off voltage in each of the plurality of stages, to the plurality of stages. The power line part 715 according to an aspect of the disclosure may include a plurality of power lines which are supplied with at least one transistor offset voltage, at least one driving voltage (or driving power source), at least one reset voltage (or reset power source), and at least one gate-off voltage (or gate-off power source) from the external control circuit or a power circuit.

Figure 3:
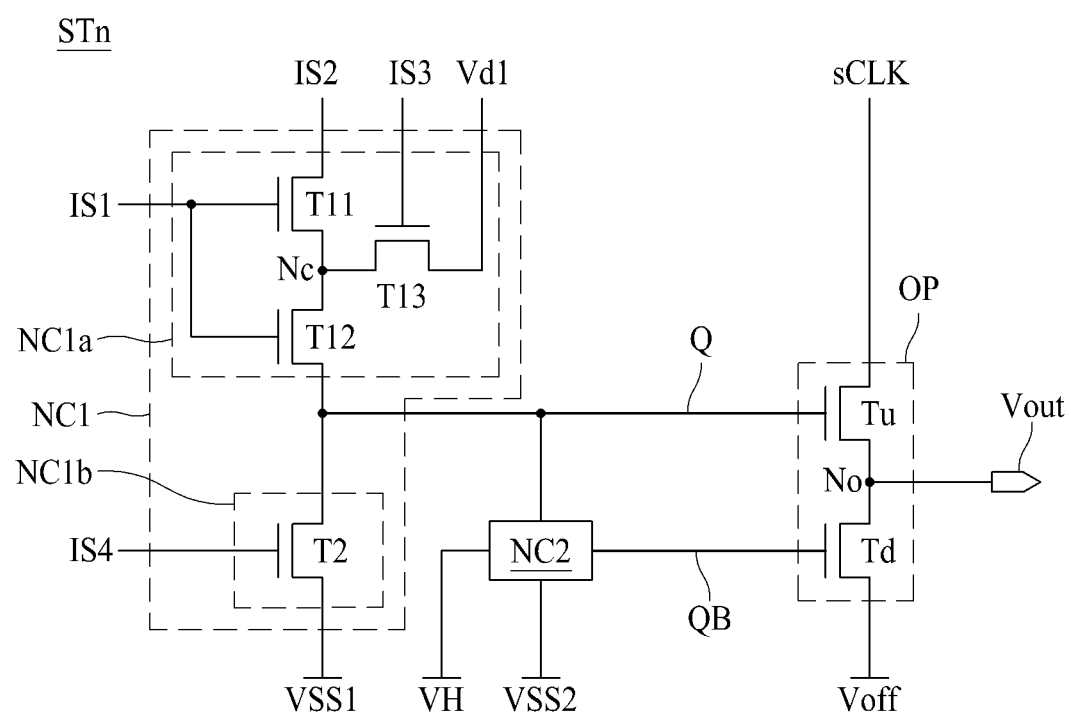
FIG. 3 is a circuit diagram for describing a stage according to an aspect illustrated in FIG. 2.

FIG. 3 is a circuit diagram for describing the stage according to an aspect of the disclosure illustrated in FIG. 2 and illustrates a configuration of an nth stage of a plurality of stages. In FIG. 3, it is illustrated that each of transistors is configured as an N-type channel transistor, but the transistors according to the present disclosure are not limited to the N-type channel transistor. In other aspects of the disclosure, each of the transistors may be configured as a P-type channel transistor.

Referring to FIG. 3, a stage STn according to an aspect of the disclosure may include an output part OP, a first node controller NC1, and a second node controller NC2.

The output part OP may output a scan clock signal sCLK or a gate-off voltage Voff to an output terminal Vout, based on a voltage of a first node Q and a voltage of a second node QB.

The output part OP according to an aspect of the disclosure may include a pull-up transistor Tu and a pull-down transistor Td.

The pull-up transistor Tu may output the scan clock signal sCLK, supplied through a scan clock signal line connected to one of the plurality of scan clock signal lines, to the output terminal Vout according to the voltage of the first node Q. The pull-up transistor Tu according to an aspect of the disclosure may include a gate electrode connected to the first node Q, a source electrode connected to an output node No, and a drain electrode connected to a scan clock signal line. The pull-up transistor Tu may be turned on based on the voltage of the first node Q and may output, as a gate-on voltage of a scan signal, the scan clock signal sCLK to the output terminal Vout through the output node No. The gate-on voltage of the scan signal may be supplied to a scan line of the display apparatus, and simultaneously, may be supplied as the start signal to one of next stages.

The pull-down transistor Td may output the gate-off voltage Voff, supplied through an input terminal corresponding to the gate-off voltage, to the output terminal Vout according to the voltage of the second node QB. Optionally, the pull-down transistor Td may be defined as an element for discharging a voltage of the output terminal Vout to a voltage level of the gate-off voltage according to the voltage of the second node QB. The pull-down transistor Td according to an aspect of the disclosure may include a gate electrode connected to the second node QB, a source electrode connected to the output node No, and a drain electrode connected to the input terminal corresponding to the gate-off voltage. The pull-down transistor Td may be turned on based on the voltage of the second node QB and may output, as the gate-off voltage of the scan signal, the gate-off voltage Voff to the output terminal Vout through the output node No.

The first node controller NC1 may set the voltage of the first node Q, based on first to third inputs signal IS1 to IS3 and a transistor offset voltage Vd1 and may reset the voltage of the first node Q, based on a fourth input signal IS4. In this case, the first node controller NC1 according to the present disclosure may include a connection node Nc which is supplied with at least one of the transistor offset voltage Vd1 and the second input signal IS2 and is preliminarily charged with the transistor offset voltage Vd1 according to the third input signal IS3.

The first input signal IS1 according to an aspect of the disclosure may be an output signal of an n−2nd stage with respect to an nth stage, the second input signal IS2 may be an output signal of the n−2nd stage which is the same as the first input signal IS1, the third input signal IS3 may be the voltage of the first node Q included in an n−1st stage with respect to the nth stage, and the fourth input signal IS4 may be an output signal of an n+3rd stage with respect to the nth stage. That is, each of the first and second input signals IS1 and IS2 may be an output signal of a second front stage with respect to the nth stage, and in this case, an input terminal corresponding to the first input signal IS1 and an input terminal corresponding to the second input signal IS2 may be electrically connected to each other and may be electrically connected to an output terminal Vout of the second front stage through one connection line. The third input signal IS3 may be a voltage of a first node Q provided in a first front stage with respect to the nth state, and in this case, an input terminal corresponding to the third input signal IS3 may be electrically connected to the first node Q of the first front stage. The fourth input signal IS4 may be an output signal of a third-rear-end stage (an n+3rd stage) with respect to the nth stage, and in this case, an input terminal corresponding to the fourth input signal IS4 may be electrically connected to an output terminal Vout of the n+3rd stage.

The transistor offset voltage Vd1 according to an aspect of the disclosure may have a voltage level which is equal to or higher than that of the second input signal IS2. That is, the transistor offset voltage Vd1 may have a voltage level which is equal to or higher than a voltage level of a first period of the second input signal IS2.

The third input signal IS3 according to an aspect of the disclosure may include first to third voltage periods which vary incrementally. A voltage of the connection node Nc may be shifted at three steps, based on the first to third voltage periods of the third input signal IS3. That is, the connection node Nc may be preliminarily charged with the transistor offset voltage Vd1 according to the third input signal IS3 during a period before being charged with the second input signal IS2, and then, may be incrementally charged with each of a voltage corresponding to the second input signal IS2 and a voltage corresponding to the transistor offset voltage Vd1 based on the third input signal IS3.

For example, in an aspect of the disclosure, the voltage of the connection node Nc may be shifted from a reference voltage level (or a floating voltage level) to a first voltage level lower than the transistor offset voltage Vd1 during the first voltage period of the third input signal IS3. That is, the voltage of the connection node Nc may be preliminarily charged with the transistor offset voltage Vd1 regardless of the second input signal IS2 during the first voltage period of the third input signal IS3. Subsequently, the voltage of the connection node Nc may be shifted from the first voltage level to a second voltage level corresponding to a voltage level of the second input signal IS2 during the second voltage period of the third input signal IS3, and during the third voltage period of the third input signal IS3, the voltage of the connection node Nc may be shifted from the second voltage level to a third voltage level corresponding to the voltage level of the second input signal IS2. Here, the first voltage level may be defined as a preliminary charging voltage (or a first-step charging voltage), the second voltage level may be defined as a second-step charging voltage, and the third voltage level may be defined as a third-step charging voltage.

In an aspect of the disclosure, since the voltage of the connection node Nc is shifted at three steps, a voltage charging characteristic of the first node Q is improved, and thus, each of the plurality of stages ST1 to STm may stably output a signal. To this end, the first to third input signals IS1 to IS3 supplied to each of the plurality of stages ST1 to STm and a timing relationship therebetween may be set as follows.

The third input signal IS3 may include a period overlapping the first period of each of the first and second input signals IS1 and IS2 corresponding to the first period of the scan clock signal.

The first voltage period of the third input signal IS3 may overlap the second period of each of the first and second input signals IS1 and IS2 corresponding to the second period of the scan clock signal and may not overlap the first period of each of the first and second input signals IS1 and IS2.

The second voltage period of the third input signal IS3 may overlap the first period of each of the first and second input signals IS1 and IS2.

The third voltage period of the third input signal IS3 may overlap the second period and a portion of the first period of each of the first and second input signals IS1 and IS2. That is, the third voltage period of the third input signal IS3 may overlap the scan clock signal sCLK supplied to an output part OP of an n−1st stage (or a first front stage). Additionally, a portion of the third voltage period of the third input signal IS3 may overlap the scan clock signal output from the output part OP. That is, a first period of the scan clock signal sCLK output from the output part OP may overlap a portion of the third voltage period of the third input signal IS3.

Moreover, the third input signal IS3 having a gate-on voltage level may be set to include a first period of the scan clock signal (i.e., the scan clock signal sCLK) output from the output part OP. Also, each of the first and second input signals IS1 and IS2 may be set not to overlap the first period of the scan clock signal (i.e., the scan clock signal sCLK) output from the output part OP.

The first node controller NC1 according to an aspect of the disclosure may include a voltage setting unit NC1a for setting the voltage of the first node Q and a voltage reset unit NC1b for resetting the voltage of the first node Q.

The voltage setting unit NC1a may set the voltage of the first node Q, based on the first to third input signals IS1 to IS3 and the transistor offset voltage Vd1. The voltage setting unit NC1a may include a 1-1st transistor T11, a 1-2nd transistor T12, and a 1-3rd transistor T13.

The 1-1st transistor T11 may form a current path between the input terminal corresponding to the second input signal IS2 and the connection node Nc in response to the first input signal IS1. That is, the 1-1st transistor T11 may supply the second input signal IS2 to the connection node Nc in response to the first input signal IS1. For example, the 1-1st transistor T11 may include a gate electrode connected to the input terminal corresponding to the first input signal IS1, a first source/drain electrode connected to the input terminal corresponding to the second input signal IS2, and a second source/drain electrode connected to the connection node Nc. Here, each of the first and second source/drain electrodes of the 1-1st transistor T11 may be a source electrode or a drain electrode, based on a direction of a current.

The 1-2nd transistor T12 may form a current path between the connection node Nc and the first node Q in response to the first input signal IS1. That is, the 1-2nd transistor T12 may supply the voltage of the connection node Nc to the first node Q. For example, the 1-2nd transistor T12 may include a gate electrode connected to the input terminal corresponding to the first input signal IS1, a first source/drain electrode connected to the connection node Nc, and a second source/drain electrode connected to the first node Q. Here, each of the first and second source/drain electrodes of the 1-2nd transistor T12 may be a source electrode or a drain electrode, based on a direction of a current.

The 1-3rd transistor T13 may form a current path between an input terminal corresponding to the transistor offset voltage Vd1 and the connection node Nc in response to the third input signal IS3 and may operate in a linear region instead of the conventional saturation region, based on the third input signal IS3. For example, the 1-3rd transistor T13 may include a gate electrode connected to the input terminal corresponding to the third input signal IS3, a first source/drain electrode connected to the input terminal corresponding to the transistor offset voltage Vd1, and a second source/drain electrode connected to the connection node Nc. Here, each of the first and second source/drain electrodes of the 1-3rd transistor T13 may be a source electrode or a drain electrode, based on a direction of a current. The 1-3rd transistor T13 may supply the transistor offset voltage Vd1 to the connection node Nc in response to the third input signal IS3, and thus, prevents the voltage charging characteristic of the first node Q from being reduced due to a threshold voltage of the 1-1st transistor T11 and completely turns off the turned-off 1-2nd transistor T12 to prevent the voltage of the first node Q from being leaked, thereby stably maintaining the voltage of the first node Q set by the voltage setting unit NC1a.

Each of the 1-1st transistor T11 and the 1-2nd transistor T12 according to an aspect of the disclosure may transfer, to the first node Q, the second input signal IS2 for setting the voltage of the first node 1, and thus, may have a relatively large channel size. In this case, the 1-1st transistor T11 and the 1-2nd transistor T12 may have the same channel size. The 1-3rd transistor T13 may increase a voltage difference between a gate voltage and a first source/drain voltage of the 1-2nd transistor T12 to completely turn off the turned-off 1-2nd transistor T12, and thus, may transfer, to the connection node Nc, the transistor offset voltage Vd1 for preventing the voltage leakage of the first node Q, whereby the 1-3rd transistor T13 may have a channel size which is relatively smaller than that of the 1-1st transistor T11.

An operation of the voltage setting unit NC1a will be described below.

First, if the third input signal IS3 is in the first voltage period and each of the first and second input signals IS1 and IS2 is the gate-off voltage, the connection node Nc may be preliminarily charged to a first voltage level which is lower than the transistor offset voltage Vd1 supplied through the 1-3rd transistor T13 turned on by the third input signal IS3. At this time, the voltage of the connection node Nc may have the first voltage level lower than the transistor offset voltage Vd1 through voltage division based on the 1-3rd transistor T13.

Subsequently, if the third input signal IS3 is in the second voltage period and each of the first and second input signals IS1 and IS2 is the gate-on voltage, the voltage of the connection node Nc may be additionally charged with a voltage corresponding to the second input signal IS2 supplied through the 1-1st transistor T11 and the 1-2nd transistor T12 turned on by the first input signal IS1 and may be shifted (or increased) to the second voltage level, and thus, the first node Q may be shifted (or increased) to the voltage of the second connection node Nc. At this time, the second input signal IS2 may be charged into the connection node Nc for a relatively short period of time due to the preliminarily charged voltage of the connection node Nc. Also, the voltage of the connection node Nc may have a voltage level corresponding to a difference voltage between a gate voltage and a threshold voltage of the 1-1st transistor T11, and the voltage of the first node Q may be limited by the voltage of the second connection node Nc.

Subsequently, if the third input signal IS3 is in the third voltage period and each of the first and second input signals IS1 and IS2 is shifted from the gate-on voltage to the gate-off voltage during a certain period, the voltage of the connection node Nc may be additionally charged with the transistor offset voltage Vd1 supplied through the 1-3rd transistor T13 certainly turned on (or pulled up) by the third input signal IS3 and may be shifted (or increased) to the third voltage level, and thus, the first node Q may be charged with a voltage corresponding to the voltage (the third voltage level) of the second connection node Nc. Theoretically, since the 1-3rd transistor T13 operates in the linear region according to the third input signal IS3, the voltage of the connection node Nc may be shifted (or increased) to the transistor offset voltage Vd1.

Subsequently, if the third input signal IS3 is in the third voltage period and each of the first and second input signals IS1 and IS2 is the gate-off voltage, each of the 1-1st transistor T11 and the 1-2nd transistor T12 may be turned off by the first input signal IS1, and thus, the voltage of the connection node Nc may be floated and maintained at the third voltage level. The voltage of the first node Q may vary (or increase) by a voltage level of the scan clock signal sCLK due to bootstrapping based on the scan clock signal sCLK.

Subsequently, if the third input signal IS3 is in the second voltage period and each of the first and second input signals IS1 and IS2 is the gate-off voltage, it may be considered that the voltage of the connection node Nc is slightly shifted (or reduced) due to coupling based on a voltage variation of the third input signal IS3, but is substantially maintained at a previous voltage level. Also, the voltage of the first node Q may be maintained at a previous voltage level.

Subsequently, if the third input signal IS3 is the gate-off voltage and each of the first and second input signals IS1 and IS2 is the gate-off voltage, the 1-3rd transistor T13 is turned off by the third input signal IS3, and thus, the voltage of the connection node Nc is floated and shifted (or reduced) to a voltage level corresponding to a voltage variation of the third input signal IS3 due to coupling based on the voltage variation of the third input signal IS3. Also, the voltage of the first node Q may be maintained at a previous voltage level.

Subsequently, the voltage of the connection node Nc and the voltage of the first node Q may be reset to a voltage level of the first reset power source VSS1, based on an operation of the voltage reset unit NC1b.

The voltage setting unit NC1a according to an aspect of the disclosure may shift the voltage of the connection node Nc at three steps by using the 1-3rd transistor T13 which operates in the linear region, based on the third input signal IS3, and thus, prevents the voltage charging characteristic of the first node Q from being reduced due to a threshold voltage of the 1-1st transistor T11 and completely turns off the turned-off 1-2nd transistor T12 to prevent the voltage of the first node Q from being leaked, thereby stably maintaining the voltage of the first node Q.

The voltage reset unit NC1b may form a current path (or a discharging path) between the first node Q and a first reset power source VSS1 in response to the fourth input signal IS4. The voltage reset unit NC1b according to an aspect of the disclosure may include a second transistor T2.

The second transistor T2 may include a gate electrode connected to an input terminal corresponding to the fourth input signal IS4, a first source/drain electrode connected to the first node Q, and a second source/drain electrode connected to the first reset power source VSS1. Here, the first and second source/drain electrodes of the second transistor T2 may each be a source electrode or a drain electrode, based on a direction of a current. The second transistor T2 may be turned on based on the fourth input signal IS4 and may connect the first node Q to the first reset power source VSS1 to reset (or initialize) the voltage of the first node Q. Here, a voltage level of the first reset power source VSS1 may be a gate-off voltage level or a first low voltage level for turning off a transistor, and thus, the first reset power source VSS1 may be referred to as a first gate-off power source or a first low level power source.

The second node controller NC2 according to an aspect of the disclosure may set a voltage of the second node QB according to the voltage of the first node Q, based on a driving power source VH and a second reset power source VSS2, and thus, may control the voltage of the second node QB to a voltage opposite to the voltage of the first node Q. That is, the second node controller NC2 may charge the second node QB to a voltage level of the driving power source VH or may discharge the voltage of the second node QB to the second reset power source VSS2, based on the voltage of the first node Q. For example, when the voltage of the first node Q is set by the first node controller NC1, the second node controller NC2 may set the voltage of the second node QB to a voltage level (a gate-off voltage level) of the second reset power source VSS2. On the other hand, when the voltage of the first node Q is reset by the first node controller NC1, the second node controller NC2 may set the voltage of the second node QB to a voltage level (a gate-on voltage level) of the driving power source VH. Here, the voltage level of the driving power source VH may be a gate-on voltage level or a high voltage level for turning on a transistor, and thus, the driving power source VH may be referred to as a first gate-on power source or a first high level power source. Also, a voltage level of the second reset power source VSS2 may be a gate-off voltage level or a second low voltage level for turning off a transistor, and thus, the second reset power source VSS2 may be referred to as a second gate-off power source or a second low level power source.

The second node controller NC2 according to an aspect of the disclosure may be configured with an inverter circuit which includes a control terminal connected to the first node Q, a first power input terminal connected to the driving power source VH, a second power input terminal connected to the second reset power source VSS2, and an output terminal connected to the second node QB.

Figure 4A:
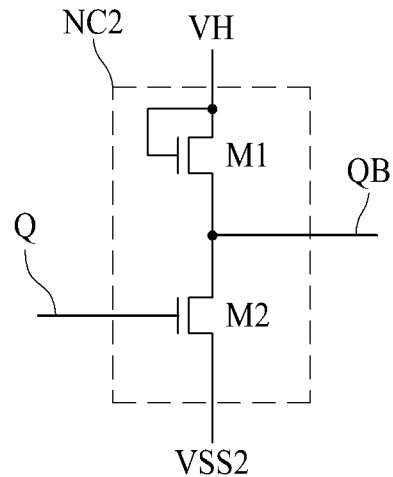
FIGS. 4A and 4B are circuit diagrams for describing a configuration of a second node controller illustrated in FIG. 3.
Figure 4B:
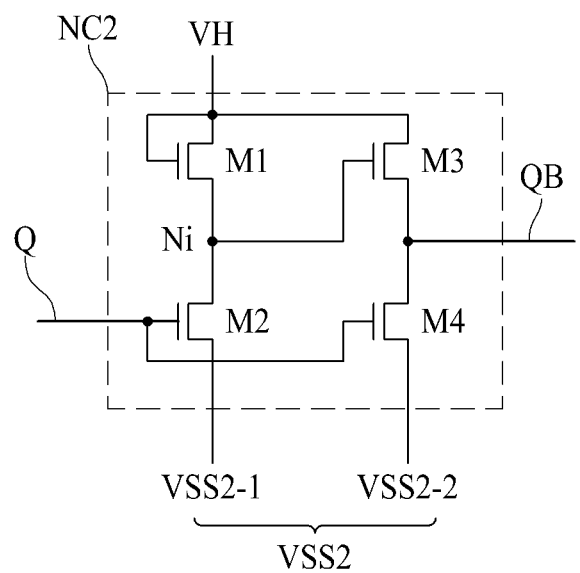

FIGS. 4A and 4B are circuit diagrams for describing a configuration of the second node controller illustrated in FIG. 3.

Referring to FIGS. 3 and 4A, a second node controller NC2 according to an aspect of the disclosure may include a first transistor M1, diode-connected between the driving power source VH and the second node QB, and a second transistor M2 which connects the second reset power source VSS2 to the second node QB according to the voltage of the first node Q.

The first transistor M1 may be turned on by a driving voltage supplied from the driving power source VH and may transfer the driving voltage to the second node QB, thereby setting the voltage of the second node QB to the voltage level (or the gate-on voltage level) of the driving power source VH.

The second transistor M2 may be turned on or off based on the voltage of the first node Q provided in the first node controller NC1, and when the second transistor M2 is turned on, the second transistor M2 may discharge the voltage of the second node QB to the second reset power source VSS2, thereby setting the voltage of the second node QB to the voltage level (or the gate-off voltage level) of the second reset power source VSS2.

When the second transistor M2 is turned off based on the voltage of the first node Q, the second node controller NC2 according to an aspect of the disclosure may charge the driving voltage of the driving power source VH into the second node QB through the first transistor M1 turned on by the driving power source VH, thereby setting the voltage of the second node QB to a voltage level (or the gate-on voltage level) of the driving power source VH. On the other hand, when the second transistor M2 is turned on based on the voltage of the first node Q, the second node controller NC2 according to an aspect of the disclosure may discharge the voltage of the second node QB to the second reset power source VSS2 through the turned-on second transistor M2, thereby setting the voltage of the second node QB to a voltage level (or the gate-off voltage level) of the second reset power source VSS2. At this time, even when the driving voltage of the driving power source VH is supplied to the second node QB through the first transistor M1 turned on by the driving power source VH, the voltage of the second node QB may be discharged to the second reset power source VSS2 through the turned-on second transistor M2. To this end, the second transistor M2 may have a channel size which is relatively larger than that of the first transistor M1.

Referring to FIGS. 3 and 4B, a second node controller NC2 according to another aspect of the disclosure may include a first transistor M1 diode-connected between the driving power source VH and an internal node Ni, a second transistor M2 which connects a 2-1st reset power source VSS2-1 to the internal node Ni with the voltage of the first node Q, a third transistor M3 which connects the driving power source VH to the second node QB with a voltage of the internal node Ni, and a fourth transistor M4 which connects a 2-2nd reset power source VSS2-2 to the second node QB with the voltage of the first node Q. Here, voltage levels of the 2-1st reset power source VSS2-1 and the 2-2nd reset power source VSS2-2 may be the same voltage levels or different voltage levels, and if the 2-1st reset power source VSS2-1 and the 2-2nd reset power source VSS2-2 have the same voltage level, the 2-1st reset power source VSS2-1 and the 2-2nd reset power source VSS2-2 may be configured as one second reset power source VSS2.

The first transistor M1 may be turned on by the driving voltage supplied from the driving power source VH and may supply the driving voltage to the internal node Ni, thereby setting a voltage of the internal node Ni to a voltage level (or the gate-on voltage level) of the driving power source VH.

The second transistor M2 may be turned on or off based on the voltage of the first node Q provided in the first node controller NC1, and when the second transistor M2 is turned on, the second transistor M2 may discharge the voltage of the internal node Ni to the 2-1st reset power source VSS2-1, thereby setting the voltage of the internal node Ni to a voltage level (or the gate-off voltage level) of the 2-1st reset power source VSS2-1.

The third transistor M3 may be turned on or off based on the voltage of the internal node Ni, and when the third transistor M3 is turned on, the third transistor M3 may transfer the driving voltage, supplied from the driving power source VH, to the second node QB to set the voltage of the second node QB to a voltage level (or the gate-on voltage level) of the driving power source VH.

The fourth transistor M4 may be turned on or off based on the voltage of the first node Q provided in the first node controller NC1, and when the fourth transistor M4 is turned on, the fourth transistor M4 may discharge the voltage of the second node QB to the 2-2nd reset power source VSS2-2, thereby setting the voltage of the second node QB to a voltage level (or the gate-off voltage level) of the 2-2nd reset power source VSS2-2.

When the second transistor M2 is turned off based on the voltage of the first node Q, the second node controller NC2 according to another aspect of the disclosure may charge the driving voltage of the driving power source VH into the internal node Ni through the first transistor M1 turned on by the driving power source VH and may charge the driving voltage into the second node QB through the third transistor M3 turned on by the voltage of the internal node Ni, thereby setting the voltage of the second node QB to a voltage level (or the gate-on voltage level) of the driving power source VH. On the other hand, when the second transistor M2 is turned on based on the voltage of the first node Q, the second node controller NC2 according to another aspect of the disclosure may discharge the voltage of the internal node Ni to the 2-1st reset power source VSS2-1 through the turned-on second transistor M2 and may simultaneously discharge the voltage of the second node QB to the 2-2nd reset power source VSS2-2 through the fourth transistor M4 turned on by the voltage of the first node Q, thereby setting the voltage of the second node QB to a voltage level (or the gate-off voltage level) of the 2-2nd reset power source VSS2-2. At this time, even when the driving voltage of the driving power source VH is supplied to the internal node Ni through the first transistor M1 turned on by the driving power source VH, the voltage of the internal node Ni may be discharged to the 2-1st reset power source VSS2-1 through the turned-on second transistor M2, and thus, the second transistor M2 connected to the internal node Ni may be turned off. To this end, the second transistor M2 may have a channel size which is relatively larger than that of the first transistor M1.

Optionally, the second node controller NC2 according to another aspect of the disclosure may be configured with one of inverters disclosed in FIGS. 29 to 32 in Korean Patent Publication No. 10-2014-0032792.

Figure 5:
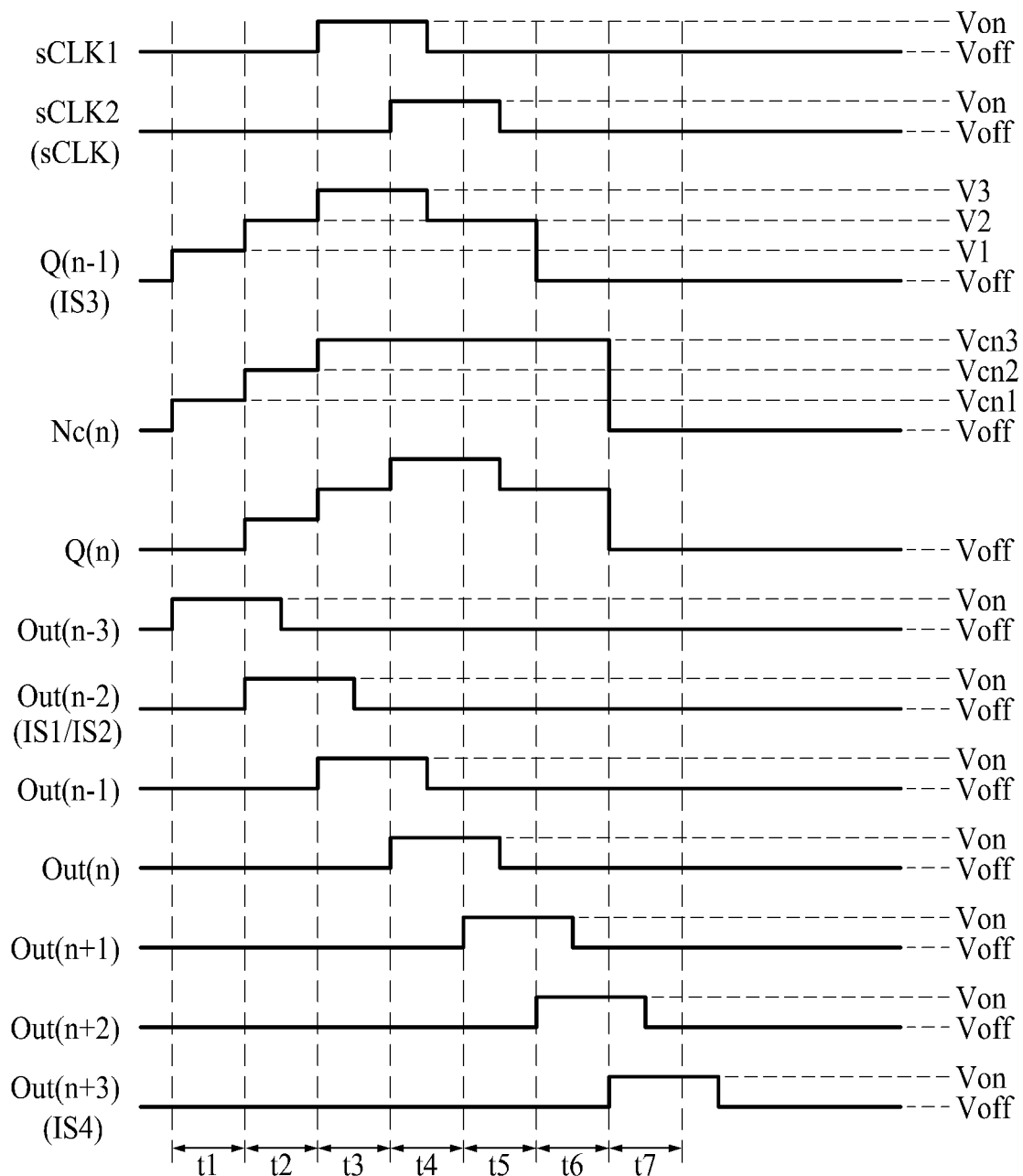
FIG. 5 is a driving waveform diagram of a stage illustrated in FIG. 3.

FIG. 5 is a driving waveform diagram of a stage illustrated in FIG. 3.

An operation of the nth stage illustrated in FIG. 3 will be described below with reference to FIG. 5.

First, the nth stage STn may output a scan clock signal sCLK2 to the output terminal Vout during first to seventh periods t1 to t7.

The first period t1 may be defined as a preliminary charging period of the connection node Nc. In the first period t1, each of the first input signal IS1, the second input signal IS2, and the fourth input signal IS4 has the gate-off voltage Voff, and the third input signal IS3 has a first voltage period of a first charging voltage V1 which is charged into a first node Q(n−1) according to an operation of a first front stage. Therefore, the voltage of the connection node Nc is preliminarily charged to a first voltage level Vcn1 lower than the transistor offset voltage Vd1 supplied through the 1-3rd transistor T13 of the first node controller NC1 turned on based on the first voltage period of the third input signal IS3.

In the second period t2, each of the first input signal IS1 and the second input signal IS2 has a gate-on voltage Von, the third input signal IS3 has a second voltage period of a second charging voltage V2 which is charged into the first node Q(n−1) according to an operation of an n−1st stage, and the fourth input signal IS4 has a gate-off voltage Voff.

Therefore, the voltage of the connection node Nc is additionally charged with a voltage corresponding to the second input signal IS2 supplied through the 1-1st transistor T11 and the 1-2nd transistor T12 turned on by the first input signal IS1 and is shifted (or increase) to a second voltage level Vcn2, and the first node Q is limited by the voltage of the second connection node Nc and is charged to the second voltage level Vcn2.

In the third period t3, the first input signal IS1 and the second input signal IS2 are shifted from the gate-on voltage Von to the gate-off voltage Voff during a certain period, the third input signal IS3 has a third voltage period of a third charging voltage V3 which is charged into the first node Q(n−1) according to a bootstrapping operation of the n−1st stage, and the fourth input signal IS4 has the gate-off voltage Voff. Therefore, the voltage of the connection node Nc is additionally charged with the transistor offset voltage Vd1 supplied through the 1-3rd transistor T13 certainly turned-on (or pulled-up) by the third input signal IS3 having the third voltage period and is shifted (or increased) to a third voltage level Vcn3, and the voltage of the first node Q is shifted (or increased) to a voltage corresponding to a voltage (or a third voltage level) of the second connection node Nc. Theoretically, since the 1-3rd transistor T13 operates in the linear region according to the third voltage period of the third input signal IS3, the voltage of the connection node Nc may be shifted (or increased) to the transistor offset voltage Vd1.

In the fourth period t4, each of the first input signal IS1 and the second input signal IS2 has the gate-off voltage Voff, the third input signal IS3 has a previous third voltage period during a certain period and then has a second voltage period of the second charging voltage V2 due to a voltage variation of the first node Q(n−1) based on an operation of the n−1st stage, the fourth input signal IS4 has the gate-off voltage Voff, and the scan clock signal sCLK2 has a first period of the gate-on voltage Von. Therefore, since the 1-1st transistor T11 and the 1-2nd transistor T12 are turned off by the first input signal IS1, the voltage of the connection node Nc is floated and maintained at the third voltage level, but is slightly shifted (or reduced) due to coupling based on a voltage variation of the third input signal IS3. The voltage of the first node Q may vary by a voltage level of the scan clock signal sCLK2 due to bootstrapping based on the scan clock signal sCLK2. The pull-up transistor Tu of the output part OP is turned on based on the voltage of the first node Q, and thus, a first period of the scan clock signal sCLK2 is output as an output signal OUT(n) through the output terminal Vout.

In the fifth period t5, each of the first input signal IS1 and the second input signal IS2 has the gate-off voltage Voff, the third input signal IS3 has a previous second voltage period, the fourth input signal IS4 has the gate-off voltage Voff, and the scan clock signal sCLK2 has a first period of the gate-on voltage Von during a certain period and then has a second period of the gate-off voltage Voff. Therefore, the voltage of the connection node Nc maintains a previous voltage level. The voltage of the first node Q may vary by a voltage level of the scan clock signal sCLK2 due to bootstrapping based on the scan clock signal sCLK2. Despite the voltage variation of the first node Q, the pull-up transistor Tu of the output part OP maintains a turn-on state, and thus, a second period of the scan output signal sCLK2 is output as an output signal OUT(n) through the output terminal Vout.

In the sixth period t6, each of the first input signal IS1 and the second input signal IS2 has the gate-off voltage Voff, the third input signal IS3 has the gate-off voltage due to a voltage variation of the first node Q(n−1) based on a reset operation of a first front stage, and the fourth input signal IS4 still has the gate-off voltage Voff. Therefore, the voltage of the connection node Nc and the voltage of the first node Q maintain a state of the previous fifth period t5.

In the seventh period t7, each of the first input signal IS1 and the second input signal IS2 has the gate-off voltage Voff, the third input signal IS3 has the gate-off voltage due to a voltage variation of the first node Q(n−1) based on a reset operation of a first front stage, and the fourth input signal IS4 has the gate-on voltage Von of an output signal OUT(n+3) supplied from an n+3rd stage. Therefore, the voltage of the connection node Nc and the voltage of the first node Q are discharged to the first reset power source VSS1 and have the gate-off voltage Voff, based on an operation of the voltage reset unit NC1b.

As described above, according to the present aspect of the disclosure, in a process of setting the voltage of the first node Q by using the first node controller NC1 provided in each of the stages ST1 to STm, the voltage of the connection node Nc provided in each of the voltage setting unit NC1a may be shifted at three steps. Therefore, a voltage charging characteristic of the first node Q is prevented from being reduced, and by completely turning off the turned-off 1-2nd transistor T12, the voltage leakage of the first node Q is prevented, thereby stably maintaining the voltage of the first node Q. Accordingly, an output signal of each of the stages ST1 to STm is more stably output. Also, according to the present aspect of the disclosure, even when a threshold voltage of the 1-1st transistor T11 provided in the first node controller NC1 of each of the stages ST1 to STm increases, the voltage charging characteristic of the first node Q is prevented from being reduced, and thus, an output signal of each of the stages ST1 to STm is more stably output. As a result, according to the present aspect of the disclosure, a range of a threshold voltage where a normal operation of the shift register is performed increases.

In the shift register 710 according to the present aspect of the disclosure, each of the stages ST1 to STm may be enabled by the first input signal IS1, namely, an output signal of the n−2nd stage. Therefore, each of the first and second stages ST1 and ST2 may be supplied with the first input signal IS1 from the external control circuit or first and second dummy stages. Also, the first stage ST1 may be supplied with the third input signal IS3 from the external control circuit or the second dummy stage. Optionally, the first stage ST1 may be disposed adjacent to a clock input unit, and thus, has an output characteristic which is relatively better than the other stages. Therefore, the first stage ST1 may receive the voltage of the first node Q thereof as the third input signal IS3, instead of receiving the third input signal IS3 from the second dummy stage, and in this case, a circuit of the first stage ST1 is easily disposed. For the same reason, each of first to jth stages ST1 to STj may receive the voltage of the first node Q thereof as the third input signal IS3, instead of receiving the third input signal IS3 from a first front stage.

In the shift register 710 according to an aspect of the disclosure, each of the stages ST1 to STm may be reset by the fourth input signal IS4, namely, an output signal of the n+3rd stage. Therefore, each of two last stages STm−1 and STm may be supplied with the fourth input signal IS4 from the external control circuit or m+1st and m+4th dummy stages.

Figure 6:
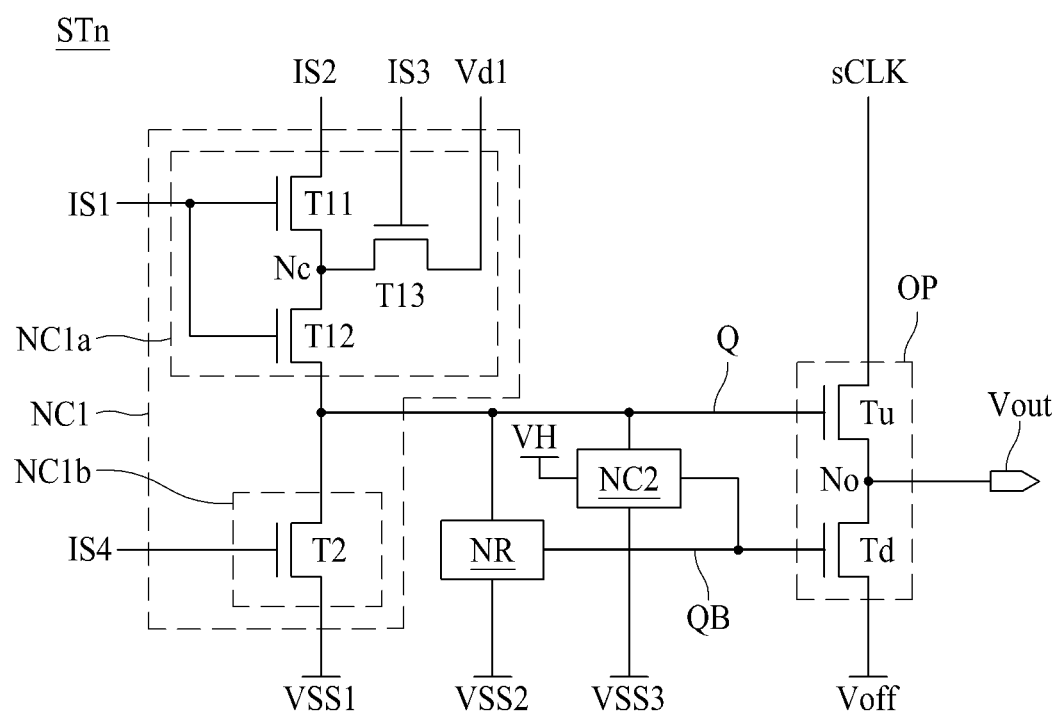
FIG. 6 is a circuit diagram for describing a stage according to an aspect illustrated in FIG. 2.

FIG. 6 is a circuit diagram for describing the stage according to an aspect of the disclosure illustrated in FIG. 2 and illustrates a configuration of an nth stage of a plurality of stages.

Referring to FIG. 6, a stage STn according to the present aspect may include an output part OP, a first node controller NC1, a second node controller NC2, and a noise removing unit NR. Except for that the noise removing unit NR is additionally provided, the stage STn having such a configuration has the same configuration as that of the stage illustrated in FIGS. 3 to 5. Hereinafter, therefore, only the noise removing unit NR and elements relevant thereto will be described, and overlapping descriptions of the other elements are omitted.

In an aspect of the disclosure, the noise removing unit NR may reset a voltage of a first node Q in response to a voltage of a second node QB. That is, in response to the voltage of the second node QB, the noise removing unit NR may form a current path (or a discharging path) between the first node Q and a third reset power source VSS3 to reset (or discharge) the voltage of the first node Q to the third reset power source VSS3, thereby removing a noise component which occurs in the first node Q. Here, while a pull-up transistor Tu of the output part OP is maintaining a turn-off state, the noise component occurs in the first node Q due to coupling between a gate electrode and a source electrode of the pull-up transistor Tu whenever a scan clock signal sCLK supplied to the pull-up transistor Tu is shifted from a second period to a first period. Therefore, the noise removing unit NR may reset (or discharge) the voltage of the first node Q to the third reset power source VSS3 in response to the voltage of the second node QB which is maintained as a gate-on voltage by the second node controller NC2, thereby removing the noise component which occurs in the first node Q due to a phase shift of the scan clock signal sCLK.

A voltage level of the third reset power source VSS3 may be a gate-off voltage level or a third low voltage level for turning off a transistor, and thus, the third reset power source VSS3 may be referred to as a noise discharging power source, a third gate-off power source, or a third low level power source.

In an aspect of the disclosure, in order to prevent the current leakage of the first node Q from occurring through a voltage reset unit NC1b and the noise removing unit NR, a voltage of a first reset power source VSS1 may have a voltage level which is lower than that of the third reset power source VSS3, and a voltage of the third reset power source VSS3 may have the same voltage level as that of a voltage of the second reset power source VSS2 supplied to the second node controller NC2.

If a voltage level of the third reset power source VSS3 is lower than that of the first reset power source VSS1, the noise removing unit NR may discharge the voltage of the first node Q to a voltage which is lower than that the voltage reset unit NC1b. That is, the voltage of the first node Q may be discharged to the first reset power source VSS1 by the voltage reset unit NC1b, and then, may be additionally discharged to the third reset power source VSS3 having a voltage level which is lower than that of first reset power source VSS1. Therefore, in an aspect of the disclosure, by removing the noise component which occurs in the first node Q due to clock coupling caused by a phase shift of the scan clock signal sCLK supplied to the output part OP while the stage STn is outputting a gate-off voltage Voff, a reset state of the first node Q is more stably maintained, and thus, the gate-off voltage Voff is more stably output.

As described above, according to an aspect of the disclosure, the same effect as that of the shift register illustrated in FIGS. 2 to 5 is obtained, and by removing the noise component occurring in the first node Q, a reset state of the first node Q is more stably maintained, whereby the gate-off voltage Voff is more stably output.

Figure 7A:
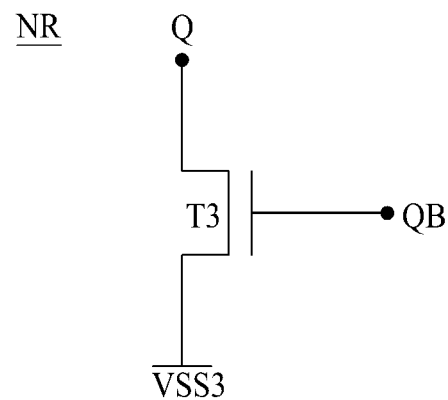
FIGS. 7A to 7C are circuit diagrams for describing a configuration of a noise removing unit illustrated in FIG. 6.
Figure 7B:
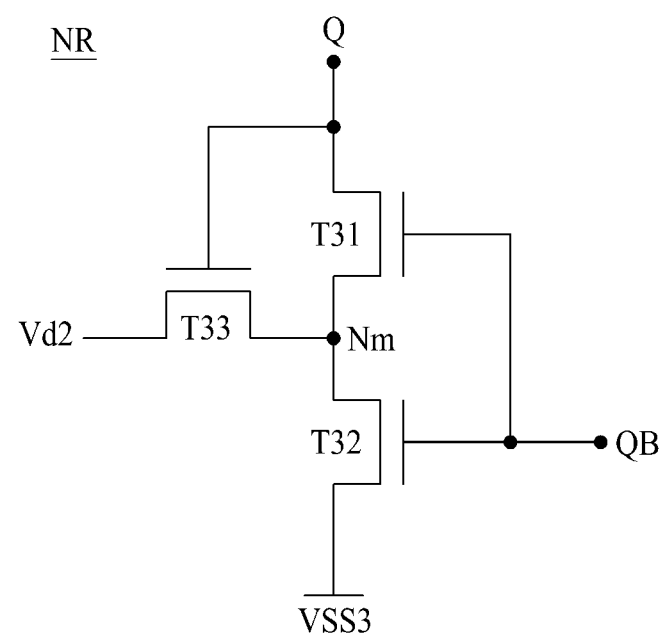
Figure 7C:
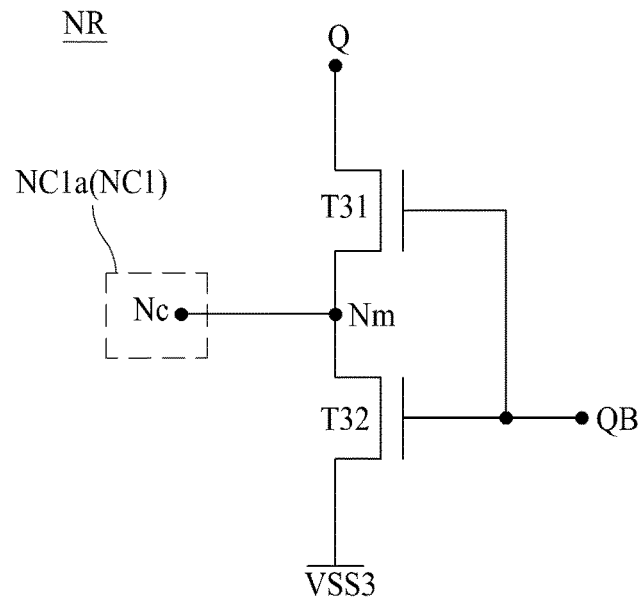

FIGS. 7A to 7C are circuit diagrams for describing a configuration of the noise removing unit illustrated in FIG. 6.

Referring to FIGS. 7A and 6, a noise removing unit NR according to an aspect may include a third transistor T3.

The third transistor T3 may include a gate electrode connected to a second node QB, a first source/drain electrode connected to a first node Q, and a second source/drain electrode connected to a third reset power source VSS3. Here, the first and second source/drain electrodes of the third transistor T3 may each be a source electrode or a drain electrode, based on a direction of a current. The third transistor T3 may be turned on based on a voltage of the second node Q having a voltage level of a gate-on voltage and may reset (or discharge) a voltage of the first node Q.

As described above, the noise removing unit NR according to an aspect of the disclosure may reset (or discharge) the voltage of the first node Q through the third transistor T3 which is turned on by the voltage of the second node Q, and thus, removes a noise component occurring in the first node Q, thereby more stably maintaining a reset state of the first node Q.

Referring to FIGS. 7B and 6, a noise removing unit NR according to another aspect of the disclosure may include 3-1st to 3-3rd transistors T31 to T33 for resetting (or discharging) a voltage of a first node Q to a third reset power source VSS3 in response to a voltage of a second node QB.

The 3-1st transistor T31 may form a current path between the first node Q and a middle node Nm in response to the voltage of the second node QB. For example, the 3-1st transistor T31 may include a gate electrode connected to the second node QB, a first source/drain electrode connected to the first node Q, and a second source/drain electrode connected to the middle node Nm. Here, the first and second source/drain electrodes of the 3-1st transistor T31 may each be a source electrode or a drain electrode, based on a direction of a current.

The 3-2nd transistor T32 may form a current path between the middle node Nm and the third reset power source VSS3 in response to the voltage of the second node QB. For example, the 3-2nd transistor T32 may include a gate electrode connected to the second node QB, a first source/drain electrode connected to the middle node Nm, and a second source/drain electrode connected to the third reset power source VSS3. Here, the first and second source/drain electrodes of the 3-2nd transistor T32 may each be a source electrode or a drain electrode, based on a direction of a current.

The 3-3rd transistor T33 may form a current path between the middle node Nm and an input terminal corresponding to a secondary transistor offset voltage Vd2 in response to the voltage of the first node Q. For example, the 3-3rd transistor T33 may include a gate electrode connected to the first node Q, a first source/drain electrode connected to the input terminal corresponding to the secondary transistor offset voltage Vd2, and a second source/drain electrode connected to the middle node Nm. Here, the first and second source/drain electrodes of the 3-3rd transistor T33 may each be a source electrode or a drain electrode, based on a direction of a current. The 3-3rd transistor T33 may supply the secondary transistor offset voltage Vd2 to the middle node Nm in response to the voltage of the first node Q to completely turn off the 3-1st transistor T31 which has been turned off by the voltage of the second node QB due to a threshold voltage of the 3-1st transistor T31, thereby preventing the voltage of the first node Q from being leaked.

As described above, the noise removing unit NR according to the present aspect may reset (or discharge) the voltage of the first node Q to the third reset power source VSS3 through the 3-1st transistor T31 and the 3-2nd transistor T32 turned on by the voltage of the second node Q, and thus, removes a noise component occurring in the first node Q, thereby more stably maintaining a reset state of the first node Q. Also, the noise removing unit NR according to an aspect of the disclosure may supply the secondary transistor offset voltage Vd2 to the middle node Nm through the 3-3rd transistor T33 turned on by the voltage of the first node Q, and thus, may set a gate-source voltage, which is lower than a threshold voltage, of the 3-1st transistor T31 turned off by the voltage of the second node QB to completely turn off the 3-1st transistor T31, thereby preventing the voltage of the first node Q from being leaked. At this time, when the threshold voltage of the 3-1st transistor T31 is shifted to a negative voltage, the gate-source voltage of the 3-1st transistor T31 may have the negative voltage lower than the threshold voltage due to the secondary transistor offset voltage Vd2 supplied to the middle node Nm through the 3-3rd transistor 33, and thus, the 3-1st transistor T31 may be put in a complete turn-off state.

Referring to FIGS. 7C and 6, a noise removing unit NR according to another aspect of the disclosure may include a 3-1st transistor T31 and a 3-2nd transistor T32, which are disposed between a first node Q and a third reset power source VSS3 and resets (or discharges) a voltage of the first node Q to the third reset power source VSS3 in response to a voltage of a second node QB, and a middle node Nm which is provided between the 3-1st transistor T31 and the 3-2nd transistor T32 and is connected to a connection node Nc of a first node controller NC1. In the noise removing unit NR according to an aspect of the disclosure, the 3-3rd transistor T33 of the noise removing unit NR illustrated in FIG. 7B is omitted, and the middle node Nm between the 3-1st transistor T31 and the 3-2nd transistor T32 may be connected to the connection node Nc provided in a voltage setting unit NC1a of the first node controller NC1. That is, in an aspect of the disclosure, the connection node Nc of the voltage setting unit NC1a may be shared by the noise removing unit NR, and the 3-1st transistor T31 of the voltage setting unit NC1a may be turned on based on a third input signal IS3 and may simultaneously supply a transistor offset voltage Vd1 to the connection node Nc and a middle node Nm of the noise removing unit NR. Also, when a voltage of the middle node Nm is reset, a voltage of the connection node Nc may be reset along with the middle node Nm.

As described above, according to an aspect of the disclosure, since the connection node Nc of the voltage setting unit NC1a is shared by the noise removing unit NR, a noise component occurring in the first node Q may be removed identically to the noise removing unit NR illustrated in FIG. 7B, and thus, a reset state of the first node Q is more stably maintained. Also, according to an aspect of the disclosure, since the 3-1st transistor T31 is completely turned off, the voltage of the first node Q is prevented from being leaked, and the number of transistors of the noise removing unit NR is reduced, thereby simplifying a circuit configuration of the noise removing unit NR to decrease a size of each stage.

Figure 8:
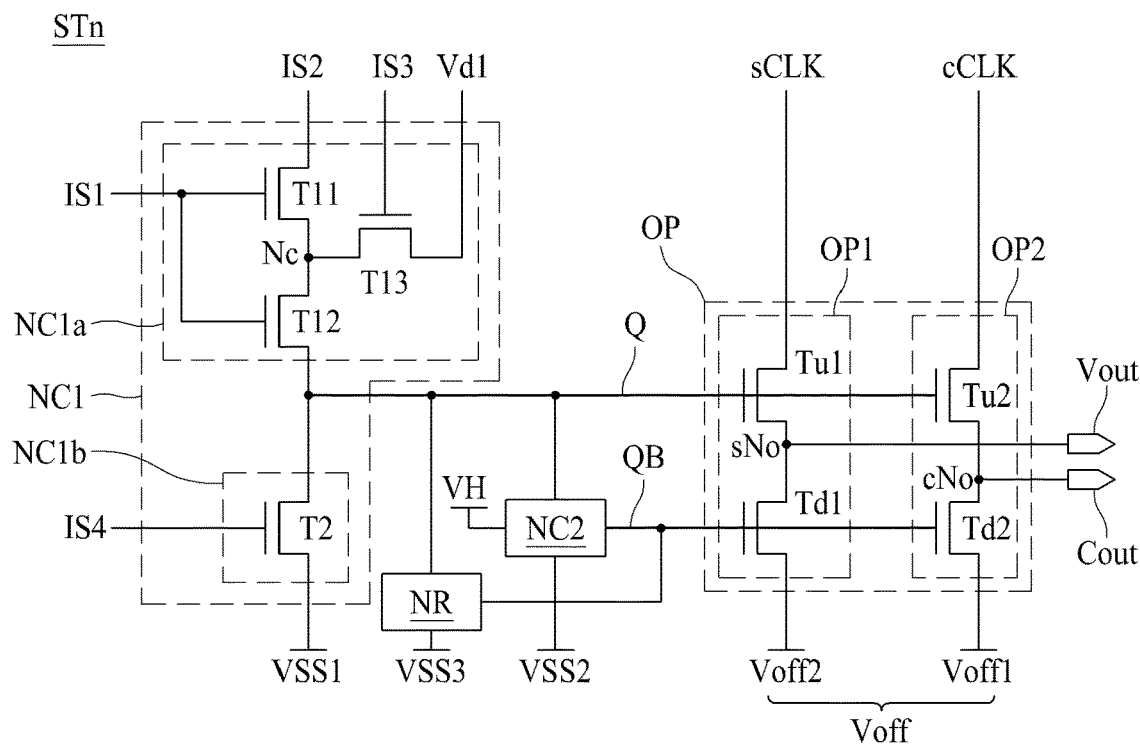
FIGS. 8 to 10 are circuit diagrams for describing a stage according to an aspect illustrated in FIG. 2.

FIG. 8 is a circuit diagram for describing a stage according to an aspect of the disclosure illustrated in FIG. 2 and illustrates a configuration of an nth stage of a plurality of stages.

Referring to FIG. 8, a stage STn according to an aspect of the disclosure may include an output part OP, a first node controller NC1, and a second node controller NC2. Except for a configuration of the output part OP, the stage STn according to an aspect of the disclosure has the same configuration as that of the stage illustrated in FIGS. 3 to 5. Hereinafter, therefore, only the output part OP and elements relevant thereto will be described, and overlapping descriptions of the other elements are omitted.

The output part OP according to an aspect of the disclosure may include a scan output part OP1 and a carry output part OP2.

The scan output part OP1 may output a scan clock signal sCLK or a first gate-off voltage Voff1 to a scan output terminal Vout, based on a voltage of a first node Q and a voltage of a second node QB. The scan output part OP1 according to an aspect of the disclosure may include a first pull-up transistor Tu1 and a first pull-down transistor Td1. Except for that the output part, the pull-up transistor, the pull-down transistor, and the output terminal illustrated in FIG. 3 are respectively replaced with the scan output part, the first pull-up transistor Tu1, the first pull-down transistor Td1, and the scan output terminal Vout, the scan output part OP1 according to aspect of the disclosure is the same as the output part illustrated in FIG. 3, and thus, its detailed description is omitted.

The carry output part OP2 may output a carry clock signal cCLK or a second gate-off voltage Voff2 to a carry output terminal Vout, based on the voltage of the first node Q and the voltage of the second node QB. The carry output part OP2 according to an aspect may include a second pull-up transistor Tu2 and a second pull-down transistor Td2.

The carry clock signal cCLK may have a first period overlapping a first period of the scan clock signal sCLK in a one-to-one relationship, and a duration of the first period may be longer than the overlapping first period of the scan clock signal sCLK.

The second pull-up transistor Tu2 may output the carry clock signal cCLK, supplied through a corresponding carry clock signal line of a plurality of carry clock signal lines, to a carry output terminal Cout according to the voltage of the first node QB. The second pull-up transistor Tu2 according to an aspect of the disclosure may include a gate electrode connected to the first node Q, a source electrode connected to a carry output node cNo, and a drain electrode connected to the carry clock signal line. The second pull-up transistor Tu2 may be turned on based on the voltage of the first node Q and may output, as a gate-on voltage of a carry signal, the carry clock signal cCLK to the carry output terminal Cout through the carry output node cNo. The gate-on voltage of the carry signal may be supplied as a start signal (or a first input signal) to one of next stages of a display apparatus.

The second pull-down transistor Td2 may output a second gate-off voltage Voff2, supplied through an input terminal corresponding to the second gate-off voltage Voff2, to the carry output terminal Cout according to the voltage of the second node QB. Optionally, the second pull-down transistor Td2 may be defined as an element for discharging a voltage of the carry output terminal Cout to a voltage level of the second gate-off voltage Voff2 according to the voltage of the second node QB. The second pull-down transistor Td2 according to an aspect of the disclosure may include a gate electrode connected to the second node QB, a source electrode connected to the carry output node cNo, and a drain electrode connected to the input terminal corresponding to the second gate-off voltage Voff2. The second pull-down transistor Td2 may be turned on based on the voltage of the second node QB and may output, as a gate-off voltage of the carry signal, the second gate-off voltage Voff2 to the carry output terminal Cout through the carry output node cNo.

Optionally, the second pull-up transistor Tu2 may supply the start signal (or the first input signal) to a next stage in a shift register, and thus, may have a channel size which is relatively smaller than that of the first pull-up transistor Tu1 of the scan output part OP1. Likewise, the second pull-down transistor Td2 may have a channel size which is relatively smaller than that of the first pull-down transistor Td1 of the scan output part OP1.

The first gate-off voltage Voff1 and the second gate-off voltage Voff2 may have the same voltage levels or different voltage levels, and if the first gate-off voltage Voff1 and the second gate-off voltage Voff2 have the same voltage level, the first gate-off voltage Voff1 and the second gate-off voltage Voff2 may be configured as one gate-off voltage Voff.

In an aspect of the disclosure, a first input signal IS1 supplied to the first node controller NC1 may be a carry output signal or a scan output signal of an n−2nd stage with respect to an nth stage. Also, a second input signal IS2 supplied to the first node controller NC1 may be the carry output signal or the scan output signal of the n−2nd stage which is the same as the first input signal IS1. For example, if the first input signal IS1 is a carry output signal, the second input signal IS2 may be the scan output signal of the n−2nd stage. A fourth input signal IS4 supplied to the first node controller NC1 may be a carry output signal or a scan output signal of an n+3rd stage.

Except for that one of carry output signals or scan output signals respectively output from a previous stage and a next stage is output as a scan clock signal or a carry clock signal according to the voltage of the first node Q and the voltage of the second node QB based on the first input signal IS1, the second input signal IS2, and the fourth input signal IS4, the stage STn according to the present aspect of the disclosure may operate identically to the stage illustrated in FIGS. 3 to 5, and thus, its detailed description is omitted.

Additionally, the stage STn according to an aspect of the disclosure may further include a noise removing unit NR. The noise removing unit NR may have one of circuit configurations illustrated in FIGS. 7A to 7C, and thus, its detailed description is omitted.

According to an aspect of the disclosure, if the carry output signal is used as the first input signal IS1, the second input signal IS2, or the fourth input signal IS4, the scan output signal is more stably output.

Figure 9:
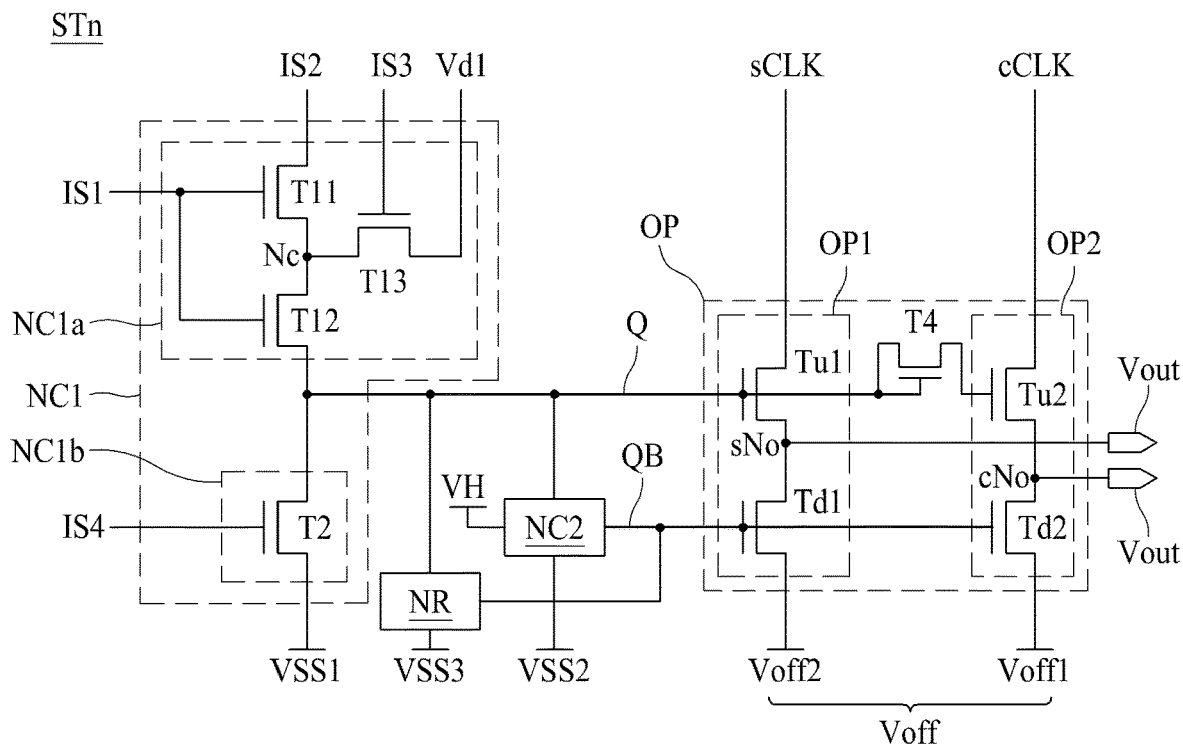

FIG. 9 is a circuit diagram for describing a stage according to an aspect of the disclosure illustrated in FIG. 2 and illustrates a configuration of an nth stage of a plurality of stages.

Referring to FIG. 9, a stage STn according to an aspect of the disclosure may include an output part OP, a first node controller NC1, and a second node controller NC2. Except for the configuration of the output part OP, the stage STn according to an aspect of the disclosure has the same configuration as that of the stage illustrated in FIG. 8. Hereinafter, therefore, only the output part OP and elements relevant thereto will be described, and overlapping descriptions of the other elements are omitted.

The output part OP according to an aspect of the disclosure may include a scan output part OP1, a carry output part OP2, and a fourth transistor T4. Except for that the output part OP further includes the fourth transistor T4, the output part OP according to an aspect of the disclosure has the same configuration as that of the output part illustrated in FIG. 8. Hereinafter, therefore, only the fourth transistor T4 and elements relevant thereto will be described.

The fourth transistor T4 according to an aspect of the disclosure may be connected between a first node Q and a gate electrode of a second pull-up transistor Tu2. The fourth transistor T4 according to an aspect of the disclosure may include a gate electrode connected to the first node Q, a first source/drain electrode connected to the first node Q, and a second source/drain electrode connected to the gate electrode of the second pull-up transistor Tu2. Here, the first source/drain electrode may be a drain electrode, and the second source/drain electrode may be a source electrode. That is, the fourth transistor T4 may be a diode-type transistor diode-connected between the first node Q and the gate electrode of the second pull-up transistor Tu2.

The fourth transistor T4 may separate a load between the first node Q and the gate electrode of the second pull-up transistor Tu2, and thus, may cause bootstrapping to occur based on a carry clock signal cCLK in the gate electrode of the second pull-up transistor Tu2. In detail, a second pull-up transistor Tu2 of the carry output part OP2 may have a channel size which is smaller than that of a second pull-up transistor Tu2 of the scan output part OP1, and thus, when bootstrapping occurs due to coupling between the carry clock signal cCLK and a capacitor (or a parasitic capacitance) of the second pull-up transistor Tu2, a gate voltage of the second pull-up transistor Tu2 may not vary by a voltage level of the carry clock signal cCLK. Therefore, the fourth transistor T4 may separate the load between the first node Q and the gate electrode of the second pull-up transistor Tu2 and may act as the capacitor of the second pull-up transistor Tu2, so that the gate voltage of the second pull-up transistor Tu2 varies by the voltage level of the carry clock signal cCLK when bootstrapping occurs due to the carry clock signal cCLK.

Therefore, since the output part OP according to an aspect of the disclosure includes the fourth transistor T4 which separates the load between the first node Q and the gate electrode of the second pull-up transistor Tu2 and acts as the capacitor of the second pull-up transistor Tu2, bootstrapping caused by the scan clock signal sCLK and bootstrapping caused by the carry clock signal cCLK occur independently, and thus, an output characteristic of each of the scan clock signal sCLK and the carry clock signal cCLK is enhanced.

As described above, the stage STn according to an aspect of the disclosure has the same effect as that of the stage illustrated in FIG. 8 and has an effect where an output characteristic of each of the scan clock signal sCLK and the carry clock signal cCLK is enhanced.

Figure 10:
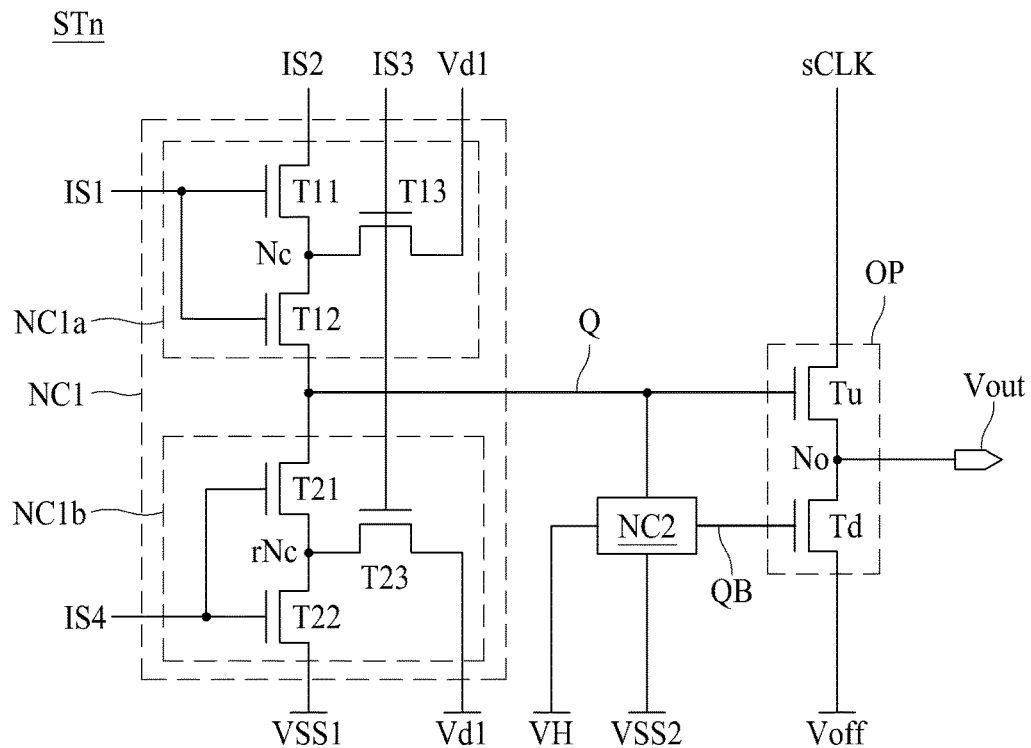

FIG. 10 is a circuit diagram for describing a stage according to an aspect of the disclosure illustrated in FIG. 2 and illustrates a configuration of an nth stage of a plurality of stages.

Referring to FIG. 10, a stage STn according to an aspect of the disclosure may include an output part OP, a first node controller NC1, and a second node controller NC2. Except for a configuration of the first node controller NC1, the stage STn according to an aspect of the disclosure has the same configuration as that of the stage illustrated in FIG. 3. Hereinafter, therefore, only the first node controller NC1 and elements relevant thereto will be described, and overlapping descriptions of the other elements are omitted.

The first node controller NC1 according to an aspect of the disclosure may include a voltage setting unit NC1a for setting a voltage of a first node Q and a voltage reset unit NC1b for resetting the voltage of the first node Q.

The voltage setting unit NC1a may set the voltage of the first node Q, based on first to third input signals IS1 to IS3 and a transistor offset voltage Vd1. The voltage setting unit NC1a according to an aspect of the disclosure may include a 1-1st transistor T11 which supplies the second input signal IS2 to a connection node Nc according to the first input signal IS1, a 1-2nd transistor T12 which supplies a voltage of the connection node Nc to the first node Q according to the first input signal IS1, and a 1-3rd transistor T13 which supplies the transistor offset voltage Vd1 to the connection node Nc according to the third input signal IS3. The voltage setting unit NC1a according to an aspect of the disclosure has the same configuration as that of the voltage setting unit illustrated in FIG. 3, and thus, its overlapping description is omitted.

The voltage reset unit NC1b may form a current path (or a discharging path) between the first node Q and a first reset power source VSS1 in response to a fourth input signal IS4. The voltage reset unit NC1b according to an aspect of the disclosure may include a 2-1st transistor T21 which forms a current path between the first node Q and a reset connection node rNc according to the fourth input signal IS4, a 2-2nd transistor T22 which forms a current path between the reset connection node rNc and a first reset power source VSS1 according to the fourth input signal IS4, and a 2-3rd transistor T23 which supplies the transistor offset voltage Vd1 to the reset connection node rNc according to the third input signal IS3. Here, the third input signal IS3 may be shared by the voltage setting unit NC1a and the voltage reset unit NC1b.

The 2-1st transistor T21 may include a gate electrode connected to an input terminal corresponding to the fourth input signal IS4, a first source/drain electrode connected to the first node Q, and a second source/drain electrode connected to the reset connection node rNc. Here, each of the first and second source/drain electrodes of the 2-1st transistor T21 may be a source electrode or a drain electrode, based on a direction of a current.

The 2-2nd transistor T22 may include a gate electrode connected to the input terminal corresponding to the fourth input signal IS4, a first source/drain electrode connected to the reset connection node rNc, and a second source/drain electrode connected to the first reset power source VSS1. Here, each of the first and second source/drain electrodes of the 2-2nd transistor T22 may be a source electrode or a drain electrode, based on a direction of a current.

The 2-3rd transistor T23 may include a gate electrode connected to an input terminal corresponding to the third input signal IS3, a first source/drain electrode connected to an input terminal corresponding to the transistor offset voltage Vd1, and a second source/drain electrode connected to the reset connection node rNc. Here, each of the first and second source/drain electrodes of the 2-3rd transistor T23 may be a source electrode or a drain electrode, based on a direction of a current. The 2-3rd transistor T23 may supply the transistor offset voltage Vd1 to the reset connection node rNc in response to the third input signal IS3, and thus, completely turns off the 2-1st transistor T21 turned off by the fourth input signal IS4 due to a threshold voltage of the 2-1st transistor T21 to prevent the voltage of the first node Q from being leaked, thereby stably maintaining the voltage of the first node Q set by the voltage setting unit NC1a.

Each of the 2-1st transistor T21 and the 2-2nd transistor T22 according to an aspect may transfer the voltage of the first node Q to the first reset power source VSS1, and thus, may have a relatively large channel size. In this case, the 2-1st transistor T21 and the 2-2nd transistor T22 may have the same channel size. The 2-3rd transistor T23 may increase a voltage difference between a gate voltage and a first source/drain voltage of the 2-2nd transistor T22 to completely turn off the turned-off 2-1st transistor T21, and thus, may transfer, to the connection node Nc, the transistor offset voltage Vd1 for preventing the voltage leakage of the first node Q, whereby the 2-3rd transistor T23 may have a channel size which is relatively smaller than that of the 2-1st transistor T21.

The voltage reset unit NC1b may operate identically to the voltage setting unit NC1a, and thus, its detailed description is omitted.

The voltage reset unit NC1b according to an aspect of the disclosure may reset (or discharge) the voltage of the first node Q to the first reset power source VSS1 through the 2-1st transistor T21 and the 2-2nd transistor T22 turned on by the fourth input signal IS4. Also, the voltage reset unit NC1b according to an aspect of the disclosure may supply the transistor offset voltage Vd1 to the reset connection node rNc through the 2-3rd transistor T23 turned on by the third input signal IS3, and thus, may set a gate-source voltage, which is lower than a threshold voltage, of the 2-1st transistor T21 turned off by the fourth input signal IS4 to completely turn off the 2-1st transistor T21, thereby preventing the voltage of the first node Q from being leaked. At this time, when the threshold voltage of the 2-1st transistor T21 is shifted to a negative voltage, the gate-source voltage of the 2-1st transistor T21 may have the negative voltage lower than the threshold voltage due to the transistor offset voltage Vd1 supplied to the reset connection node rNc through the 2-3rd transistor 23, and thus, the 2-1st transistor T21 may be put in a complete turn-off state.

Particularly, the voltage reset unit NC1b according to an aspect of the disclosure may shift the voltage of the reset connection node rNc at three steps by using the 2-3rd transistor T23 which operates in the linear region, based on the third input signal IS3, and thus, prevents a voltage charging characteristic of the first node Q from being reduced due to a threshold voltage of the 2-1st transistor T21 and completely turns off the turned-off 2-1st transistor T21 to prevent the voltage of the first node Q from being leaked, thereby stably maintaining the voltage of the first node Q.

Additionally, in each stage of the shift register according to an aspect of the disclosure, a circuit configuration of each of the second node controller NC2 and the output part OP may be replaced with a circuit configuration illustrated in FIGS. 4 to 9. Also, each stage of the shift register according to an aspect of the disclosure may further include the noise removing unit illustrated in FIGS. 7A to 7C.

As described above, according to an aspect of the disclosure, the voltage reset unit NC1b additionally prevents the voltage of the first node Q from being leaked, and thus, more improves the voltage charging characteristic of the first node Q, whereby each of a plurality of stages ST1 to STm may more stably output a signal.

Figure 11:
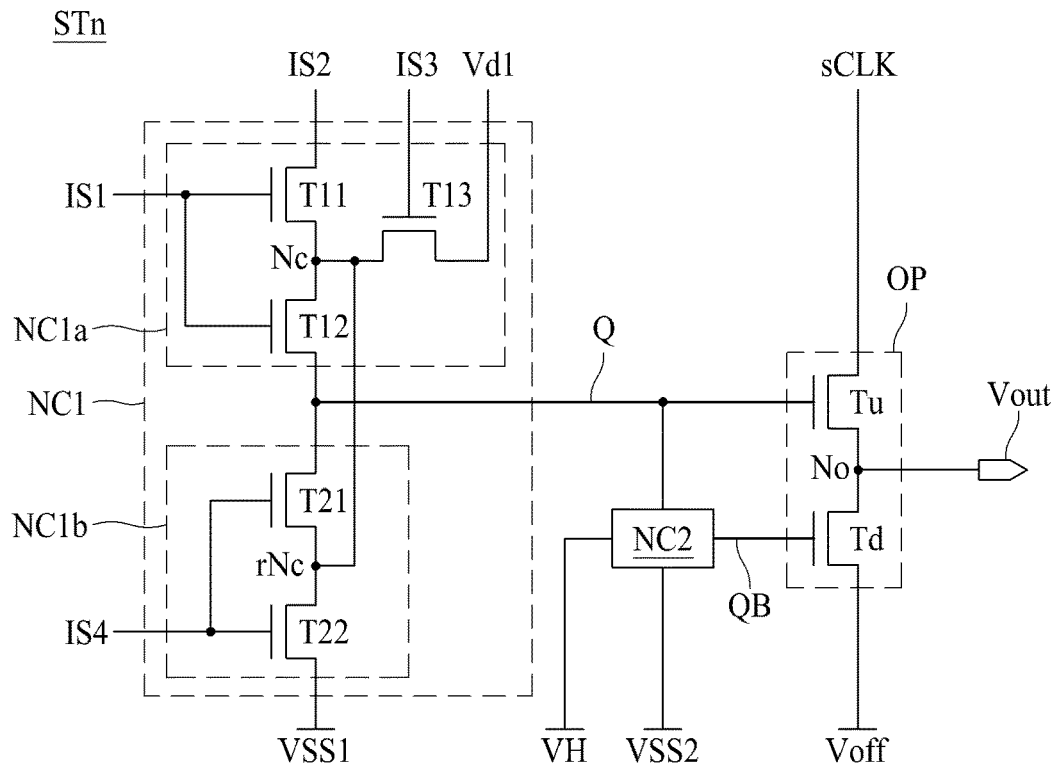
FIG. 11 is a circuit diagram for describing a modified aspect of a stage illustrated in FIG. 10.

A voltage reset unit NC1b according to another aspect of the disclosure, as illustrated in FIG. 11, may include a reset connection node rNc connected to a connection node Nc provided in a voltage setting unit NC1a, a 2-1st transistor T21 which forms a current path between a first node Q and the reset connection node rNc according to a fourth input signal IS4, and a 2-2nd transistor T22 which forms a current path between the reset connection node rNc and a first reset power source VSS1 according to the fourth input signal IS4. In the voltage reset unit NC1b according to an aspect of the disclosure, the 2-3rd transistor T23 of the voltage reset unit illustrated in FIG. 10 is omitted, and the reset connection node rNc between the 2-1st transistor T21 and the 2-2nd transistor T22 may be directly connected to the connection node Nc provided in the voltage setting unit NC1a. That is, in an aspect of the disclosure, the connection node Nc of the voltage setting unit NC1a may be shared by the voltage reset unit NC1b, and a 1-3rd transistor T13 of the voltage setting unit NC1a may be turned on based on a third input signal IS3 and may simultaneously supply a transistor offset voltage Vd1 to the connection node Nc and the reset connection node rNc.

As described above, according to an aspect of the disclosure, since the connection node Nc of the voltage setting unit NC1a is shared by the voltage reset unit NC1b, the voltage leakage of the first node Q is additionally prevented identically to the voltage reset unit NC1b illustrated in FIG. 10, and thus, a voltage charging characteristic of the first node Q is more improved, whereby each of a plurality of stages ST1 to STm may more stably output a signal. Also, according to an aspect, the number of transistors of the voltage reset unit NC1b is reduced, and thus, a circuit configuration of the voltage reset unit NC1b is simplified, thereby decreasing a size of each stage.

Figure 12:
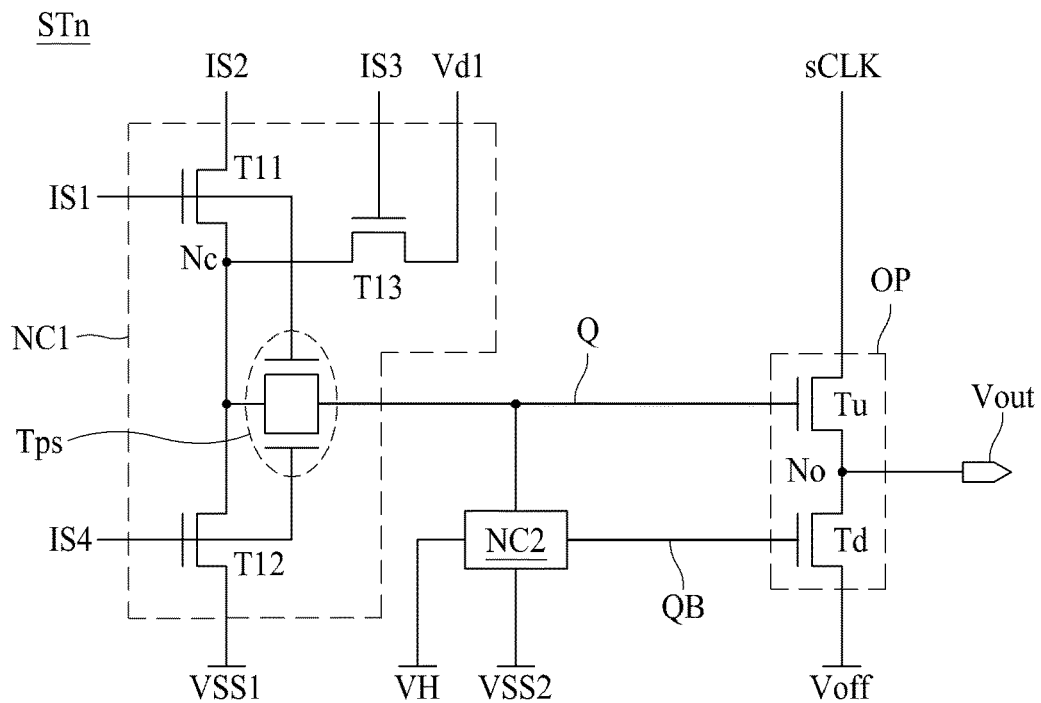
FIG. 12 is a circuit diagram for describing a stage according to an aspect illustrated in FIG. 2.

FIG. 12 is a circuit diagram for describing a stage according to an aspect of the disclosure illustrated in FIG. 2 and illustrates a configuration of an nth stage of a plurality of stages.

Referring to FIG. 12, a stage STn according to an aspect of the disclosure may include an output part OP, a first node controller NC1, and a second node controller NC2. Except for a configuration of the first node controller NC1, the stage STn according to an aspect of the disclosure has the same configuration as that of the stage illustrated in FIG. 3. Hereinafter, therefore, only the first node controller NC1 and elements relevant thereto will be described, and overlapping descriptions of the other elements are omitted.

The first node controller NC1 according to an aspect of the disclosure may include a 1-1st transistor T11 which supplies a second input signal IS2 to a connection node Nc according to a first input signal IS1, a 1-2nd transistor T12 which forms a current path between the connection node Nc and a first reset power source VSS1 according to a fourth input signal IS4, a 1-3rd transistor T13 which supplies the transistor offset voltage Vd1 to the connection node Nc according to the third input signal IS3, and a pass transistor Tps which forms a current path between the connection node Nc and a first node Q according to the first input signal IS1 and the fourth input signal IS4.

The 1-1st transistor T11 may form a current path between the connection node Nc and an input terminal corresponding to the second input signal IS2 in response to the first input signal IS1. For example, the 1-1st transistor T11 may include a gate electrode connected to an input terminal corresponding to the first input signal IS1, a first source/drain electrode connected to the input terminal corresponding to the second input signal IS2, and a second source/drain electrode connected to the connection node Nc. Here, the first and second source/drain electrodes of the 1-1st transistor T11 may each be a source electrode or a drain electrode, based on a direction of a current.

The 1-2nd transistor T12 may supply a voltage of the first reset power source VSS1 to the connection node Nc in response to the fourth input signal IS4. For example, the 1-2nd transistor T12 may include a gate electrode connected to an input terminal corresponding to the fourth input signal IS4, a first source/drain electrode connected to the connection node Nc, and a second source/drain electrode connected to the first reset power source VSS1. Here, the first and second source/drain electrodes of the 1-2nd transistor T12 may each be a source electrode or a drain electrode, based on a direction of a current.

The 1-3rd transistor T13 may form a current path between an input terminal corresponding to the transistor offset voltage Vd1 and the connection node Nc in response to the third input signal IS3 and may operate in a linear region instead of a conventional saturation region, based on the third input signal IS3. For example, the 1-3rd transistor T13 may include a gate electrode connected to the input terminal corresponding to the third input signal IS3, a first source/drain electrode connected to the input terminal corresponding to the transistor offset voltage Vd1, and a second source/drain electrode connected to the connection node Nc. Here, each of the first and second source/drain electrodes of the 1-3rd transistor T13 may be a source electrode or a drain electrode, based on a direction of a current. The 1-3rd transistor T13 may shift the voltage of the connection node Nc at three steps in response to the third input signal IS3, and thus, prevents a voltage charging characteristic of the first node Q from being reduced due to a threshold voltage of each of the 1-1st transistor T11 and the 1-2nd transistor T12 and completely turns off the turned-off 1-2nd transistor T12 to prevent the voltage of the first node Q from being leaked, thereby stably setting the voltage of the first node Q.

The pass transistor Tps may be a transistor having a double gate structure which supplies the voltage of the connection node Nc to the first node Q in response to the first input signal IS1 and discharges the voltage of the first node Q to the first reset power source VSS1 in response to the second input signal IS2. For example, the pass transistor Tps may include a bottom gate electrode connected to the input terminal corresponding to the first input signal IS1, a top gate electrode connected to the input terminal corresponding to the fourth input signal IS4, a first source/drain electrode connected to the connection node Nc, and a second source/drain electrode connected to the first node Q.

Optionally, in the pass transistor Tps, the bottom gate electrode may be connected to the input terminal corresponding to the fourth input signal IS4, and the top gate electrode may be connected to the input terminal corresponding to the first input signal IS1. That is, in the pass transistor Tps, the bottom gate electrode may be connected to one of the input terminal corresponding to the first input signal IS1 and the input terminal corresponding to the fourth input signal IS4, and the top gate electrode may be connected to the other of the input terminal corresponding to the first input signal IS1 and the input terminal corresponding to the fourth input signal IS4.

Except for that the pass transistor Tps having the double gate structure forms a current path between the connection node Nc and the first node Q, the first node controller NC1 according to an aspect of the disclosure is the same as the first node controller NC1 illustrated in FIG. 11, and thus, its detailed description is omitted.

Additionally, in each stage of the shift register according to the present aspect, a circuit configuration of each of the second node controller NC2 and the output part OP may be replaced with a circuit configuration illustrated in FIGS. 4 to 9. Also, each stage of the shift register according to an aspect of the disclosure may further include the noise removing unit illustrated in FIGS. 7A to 7C.

As described above, according to an aspect of the disclosure, the voltage leakage of the first node Q is prevented identically to the shift register illustrated in FIG. 11, and a voltage charging characteristic of the first node Q is more improved, whereby each of a plurality of stages ST1 to STm may more stably output a signal. Also, according to an aspect of the disclosure, by using the pass transistor Tps having the double gate structure, a circuit configuration of the first node controller NC1 can be simplified, and an area occupied by circuits can be reduced, thereby decreasing the size of each stage.

Figure 13:
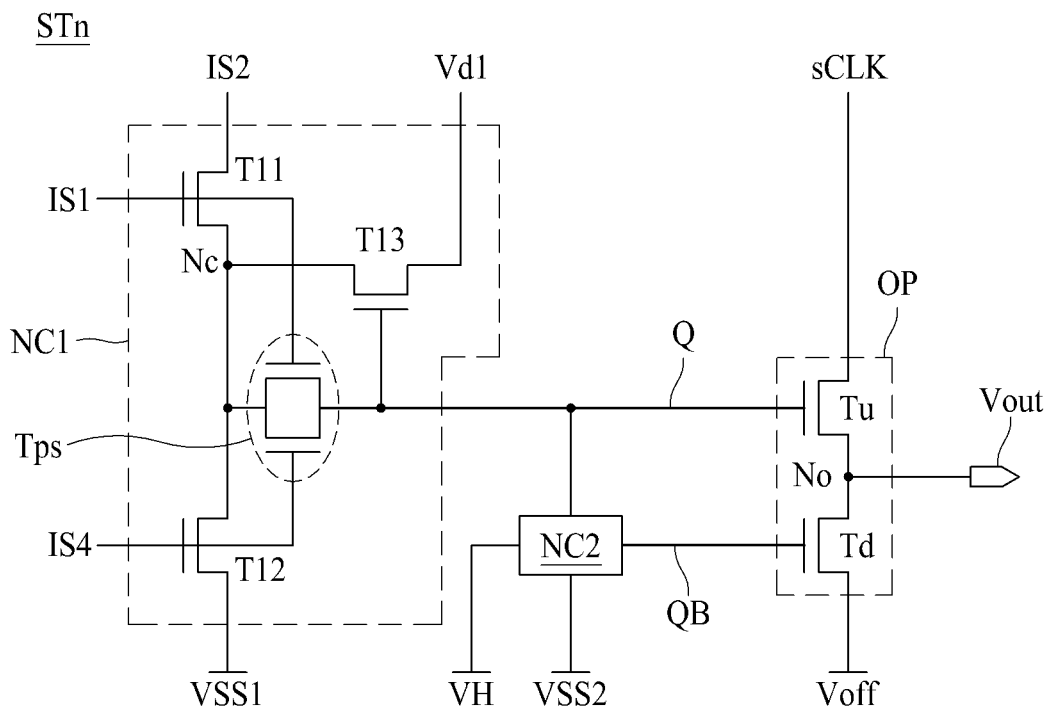
FIG. 13 is a circuit diagram for describing a modified aspect of a stage illustrated in FIG. 12.

In a shift register according to an aspect of the disclosure, as illustrated in FIG. 13, a third input signal IS3 supplied to a first node controller NC1 of each of a plurality of stages may be a voltage of a first node Q. That is, in each of a plurality of stages, the first node Q may be electrically connected to a gate electrode of a 1-3rd transistor T13 included in a first node controller NC1. In other words, the 1-3rd transistor T13 included in the first node controller NC1 of an nth stage STn may be turned on or off in response to a voltage of a first node Q of the nth stage STn instead of a voltage of a first node Q of an n−1st stage. In this case, as in the related art, the shift register according to an aspect of the disclosure has a problem where a voltage charging characteristic of the first node Q is reduced when a threshold voltage of a 1-1st transistor T11 provided in the first node controller NC1 increases. However, in the shift register according to an aspect of the disclosure, by using a pass transistor Tps having the double gate structure, a circuit configuration of the first node controller NC1 can be simplified, and an area occupied by circuits can be reduced. Also, in the shift register according to an aspect of the disclosure, a relatively number of stages may be provided on a substrate having limited size, and thus, the shift register according to an aspect of the disclosure may be applied to a case where a larger number of stages are provided in a circuit area of a related art shift register.

In a stage illustrated in FIG. 13, each of a first input signal IS1 and a second input signal IS2 may be an output signal from one of previous stages, and a fourth input signal IS4 may be an output signal from one of next stages. For example, each of the first input signal IS1 and the second input signal IS2 may be an output signal of an n−1st stage. Also, the fourth input signal IS4 may be an output signal of an n+1st stage. As another example, in order to minimize a reduction in voltage charging characteristic of the first node Q when the threshold voltage of the 1-1st transistor T11 provided in the first node controller NC1 increases, each of the first input signal IS1 and the second input signal IS2 may be an output signal of an n−2nd stage. Also, the fourth input signal IS4 may be an output signal of an n+3rd stage. Here, in a case where an output part OP includes a scan output part and a carry output part, the first input signal IS1 may be an output signal of the carry output part, the second input signal IS2 may be an output signal of the scan output part or the carry output part, and the fourth input signal IS4 may be an output signal of the scan output part.

Figure 14:
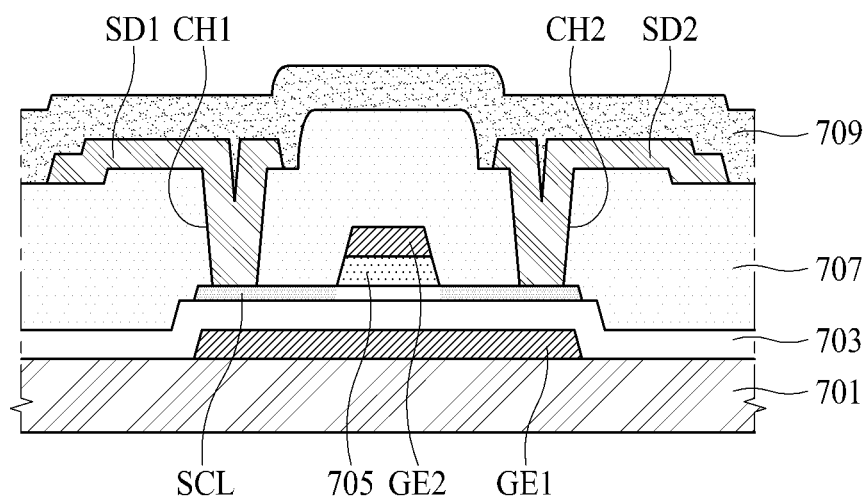
FIG. 14 is a cross-sectional view schematically illustrating a structure of a pass transistor illustrated in FIG. 12 or 13.

FIG. 14 is a cross-sectional view schematically illustrating a structure of the pass transistor illustrated in FIG. 12 or 13.

Referring to FIGS. 14 and 12 or 13, the pass transistor Tps according to an aspect of the disclosure may include a bottom gate electrode GE1 which is provided on a substrate 701, a buffer layer 703 which is provided on the substrate 701 to cover the bottom gate electrode GE1, a semiconductor layer SCL which overlaps the bottom gate electrode GE1 and includes a channel region, a first source/drain region, and a second source/drain region, a gate insulation layer 705 which is provided in the channel region of the semiconductor layer SCL, a top gate electrode GE2 which is stacked on the gate insulation layer 705, an interlayer insulation layer 707 which is provided on the buffer layer 703 to cover the semiconductor layer SCL and the top gate electrode GE2, a first source/drain electrode SD1 which is electrically connected to the first source/drain region of the semiconductor layer SCL through a first contact hole CH1 formed in the interlayer insulation layer 707, a second source/drain electrode SD2 which is electrically connected to the second source/drain region of the semiconductor layer SCL through a second contact hole CH2 formed in the interlayer insulation layer 707, and a passivation layer 709 which is provided on the interlayer insulation layer 707 to cover the first source/drain electrode SD1 and the second source/drain electrode SD2.

The semiconductor layer SCL may include an oxide semiconductor material such as ZnO, InZnO, InGaZnO$_4$, or the like, but without being limited thereto. In other aspects of the disclosure, semiconductor layer SCL may include silicon or an organic material in addition to the oxide semiconductor material.

The bottom gate electrode GE1 may be connected to one of the input terminal corresponding to the first input signal IS1 and the input terminal corresponding to the fourth input signal IS4. For example, the bottom gate electrode GE1 may be connected to the input terminal corresponding to the first input signal IS1.

The top gate electrode GE2 may be connected to one of the input terminal corresponding to the first input signal IS1 and the input terminal corresponding to the fourth input signal IS4, namely, may be connected to the other input terminal which is not connected to the bottom gate electrode GE1. For example, the top gate electrode GE2 may be connected to the input terminal corresponding to the first input signal IS1.

The bottom gate electrode GE1 and the top gate electrode GE2 may have the same size. However, in a case where the pass transistor Tps includes the semiconductor layer SCL, the bottom gate electrode GE1 may be formed to have a size which is equal to or greater than that of the semiconductor layer SCL, in order to block light incident on the semiconductor layer SCL and thus prevent a light leakage current of the semiconductor layer SCL caused by the incident light.

The first source/drain electrode SD1 may be electrically connected to the connection node Nc, and the second source/drain electrode SD2 may be electrically connected to the first node Q. On the other hand, the first source/drain electrode SD1 may be electrically connected to the first node Q, and the second source/drain electrode SD2 may be electrically connected to the connection node Nc.

The pass transistor Tps according to an aspect of the disclosure may form a current path between the connection node Nc and the first node Q in response to the first input signal IS1 supplied to the bottom gate electrode GE1 or the second input signal IS2 supplied to the top gate electrode GE2.

As described above, since the pass transistor Tps according to an aspect of the disclosure has a double gate structure, the number of transistors of the first node controller NC1 is reduced, and thus, a circuit area of the first node controller NC1 can be reduced.

Additionally, in each of the stages according to the present disclosure illustrated in FIGS. 1 to 14, in order to increase a width of an output period (or a transistor on voltage level period) of an output signal, each of the first input signal IS1 and the second input signal IS2 may be set as an output signal of each of previous stages STn−3, STn−4, . . . of an n−2nd stage, and the fourth input signal IS4 may be set as an output signal of each of stages STn+4, STn+5, . . . subsequent to an n+3rd stage. As a result, each of the first input signal IS1 and the second input signal IS2 may be set as an output signal of an n−ith (where i is a natural number equal to or more than two) stage, and the fourth input signal IS4 may be set as an output signal of an n−jth (where j is a natural number equal to or more than three) stage.

Figure 15:
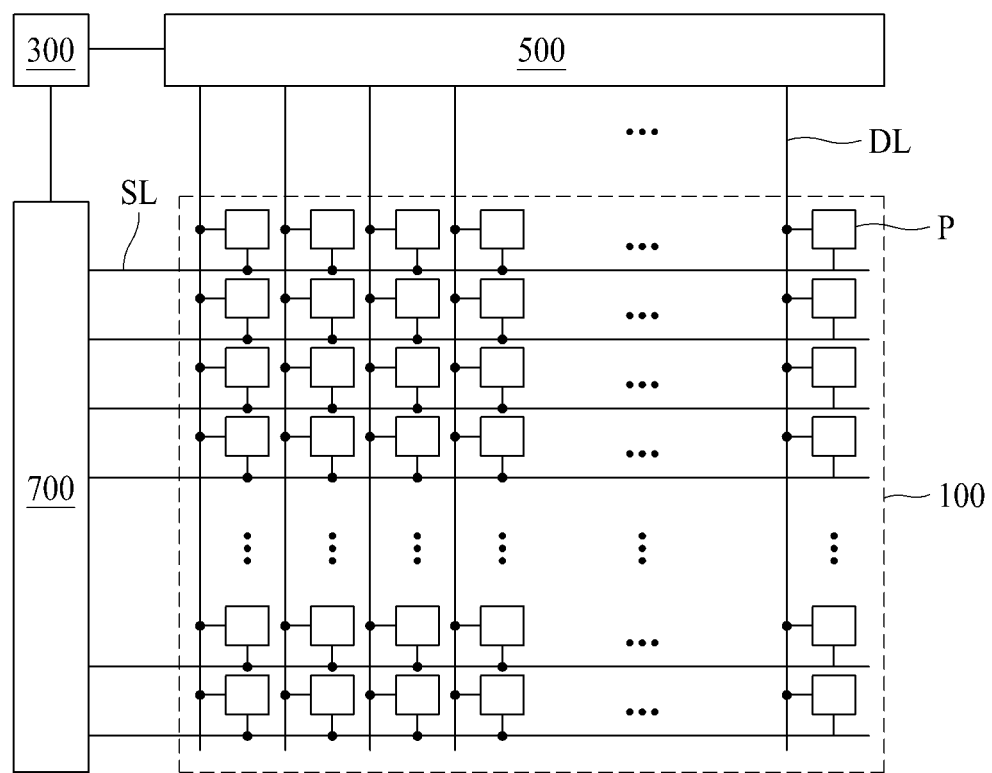
FIG. 15 is a diagram schematically illustrating a display apparatus according to an aspect of the present disclosure.

FIG. 15 is a diagram schematically illustrating a display apparatus according to an aspect of the present disclosure.

Referring to FIG. 15, the display apparatus according to an aspect of the disclosure may include a pixel array part 100, a control circuit 300, a data driving circuit 500, and a scan driving circuit 700.

The pixel array part 100 may include a plurality of scan lines SL and a plurality of data lines DL provided on a substrate and a plurality of pixels P respectively provided in a plurality of pixel areas defined by intersections of the plurality of scan lines SL and the plurality of data lines DL.

Each of the plurality of pixels P may include a pixel cell which displays an image, based on a scan signal supplied through an adjacent scan line SL and a data signal supplied through an adjacent data line DL. In this case, the pixel cell may include at least one TFT and at least one capacitor and may be a liquid crystal cell which drives liquid crystal according to an electric field based on a data signal to display an image, or may be a self-emitting cell which self-emits light based on a data signal to display an image. Here, the self-emitting cell may include a plasma discharging element, a quantum dot light emitting element, an organic light emitting element, an inorganic light emitting element, or a micro light emitting diode.

The control circuit 300 may generate pixel data corresponding to each of the plurality of pixels P, based on an image signal. The control circuit 300 may generate a data control signal, based on a timing synchronization signal and may supply the data control signal to the data driving circuit 500. The control circuit 300 may generate a scan control signal including a plurality of scan clock signals and a start signal, based on the timing synchronization signal and may supply the scan control signal to the scan driving circuit 700. The control circuit 300 may additionally generate a plurality of carry clock signals to supply the plurality of carry clock signals to the scan driving circuit 700, based on a driving manner of the scan driving circuit 700

The data driving circuit 500 may be connected to the plurality of data lines DL provided in the pixel array part 100. The data driving circuit 500 may receive pixel data and the data control signal supplied from the control circuit 300 and may receive a plurality of reference gamma voltages supplied from a power source circuit. The data driving circuit 500 may convert the pixel data into a pixel-based analog data signal by using the data control signal and the plurality of reference gamma voltages and may supply the pixel-based data signal to a corresponding data line DL.

The scan driving circuit 700 may be connected to the plurality of scan lines provided in the pixel array part 100. The scan driving circuit 700 may generate a scan signal and may supply the scan signal to a corresponding scan line SL in a predetermined order, based on the scan control signal supplied from the control circuit 300. The scan driving circuit 700 may include the shift register included in FIGS. 2 to 14, and thus, its detailed description is omitted.

The scan driving circuit 700 according to an aspect of the disclosure may be integrated in one edge or both edges of the substrate and may be connected to the plurality of scan lines SL in a one-to-one relationship through a process of manufacturing a TFT. The scan driving circuit 700 according to an aspect of the disclosure may be provided in an IC, mounted on or the substrate or a flexible circuit film, and connected to the plurality of scan lines SL in a one-to-one relationship.

As described above, since the display device according to an aspect of the disclosure includes the shift register of the present disclosure, an output characteristic of the scan driving circuit 700 can be improved, and thus, a stability of the scan signal supplied to the plurality of scan lines can be improved.

As described above, according to aspects of the present disclosure, an output signal of each stage included in the shift register is more stably output, and the shift register may increase a range of a threshold voltage which enables the shift register to normally operate.

Moreover, according to various aspects of the present disclosure, the size of each stage included in the shift register can be reduced.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A shift register having a plurality of stages, each of the plurality of stages comprising:
    an output part outputting a scan clock signal or a gate-off voltage in accordance with a voltage of a first node and a voltage of a second node;
    a first node controller setting the voltage of the first node in accordance with first to third input signals and a transistor offset voltage and resetting the voltage of the first node, in accordance with a fourth input signal; and
    a second node controller controlling the voltage of the second node in accordance with the voltage of the first node,
    wherein the first node controller includes a connection node supplied with at least one of the transistor offset voltage and the second input signal and preliminarily charged with the transistor offset voltage in accordance with the third input signal, and
    wherein the third input signal includes first to third voltage periods which are incrementally shifted, and a voltage of the connection node is shifted at three steps during the first to third voltage periods of the third input signal.

2. The shift register of claim 1, wherein the third input signal is a voltage of a first node included in an n−1st stage.

3. The shift register of claim 2, wherein
    each of the first input signal and the second input signal is an output signal of an n−ith (where i is a natural number equal to or more than two) stage, and
    the fourth input signal is an output signal of an n+jth (where j is a natural number equal to or more than three) stage.

4. The shift register of claim 1, wherein
    during the first voltage period of the third input signal, the voltage of the connection node is shifted from a reference voltage level to a first voltage level which is lower than a voltage level of the transistor offset voltage,
    during the second voltage period of the third input signal, the voltage of the connection node is shifted from the first voltage level to a second voltage level corresponding to a voltage level of the second input signal, and
    during the third voltage period of the third input signal, the voltage of the connection node is shifted from the second voltage level to a third voltage level corresponding to the voltage level of the transistor offset voltage.

5. The shift register of claim 4, wherein a portion of the third voltage period of the third input signal overlaps the scan clock signal output from the output part.

6. The shift register of claim 1, wherein the first input signal does not overlap the scan clock signal output from the output part.

7. The shift register of claim 1, wherein the first node controller further comprises:
a voltage setting unit setting the voltage of the first node; and
a voltage reset unit resetting the voltage of the first node.

8. The shift register of claim 7, wherein the voltage setting unit further comprises:
a 1-1st transistor including a gate electrode connected to an input terminal corresponding to the first input signal, a first source/drain electrode connected to an input terminal corresponding to the second input signal, and a second source/drain electrode connected to the connection node;
a 1-2nd transistor including a gate electrode connected to the input terminal corresponding to the first input signal, a first source/drain electrode connected to the connection node, and a second source/drain electrode connected to the first node; and
a 1-3rd transistor including a gate electrode connected to an input terminal corresponding to the third input signal, a first source/drain electrode connected to an input terminal corresponding to the transistor offset voltage, and a second source/drain electrode connected to the connection node.

9. The shift register of claim 7, wherein the voltage reset unit further comprises:
a 2-1st transistor including a gate electrode connected to an input terminal corresponding to the fourth input signal, a first source/drain electrode connected to the first node, and a second source/drain electrode connected to a reset connection node;
a 2-2nd transistor including a gate electrode connected to the input terminal corresponding to the fourth input signal, a first source/drain electrode connected to the reset connection node, and a second source/drain electrode connected to a first reset power source; and
a 2-3rd transistor including a gate electrode connected to the input terminal corresponding to the third input signal, a first source/drain electrode connected to the input terminal corresponding to the transistor offset voltage, and a second source/drain electrode connected to the reset connection node.

10. The shift register of claim 7, wherein the voltage reset unit further comprises:
a reset connection node connected to the connection node of the voltage setting unit;
a 2-1st transistor including a gate electrode connected to an input terminal corresponding to the fourth input signal, a first source/drain electrode connected to the first node, and a second source/drain electrode connected to a reset connection node; and
a 2-2nd transistor including a gate electrode connected to the input terminal corresponding to the fourth input signal, a first source/drain electrode connected to the reset connection node, and a second source/drain electrode connected to a first reset power source.

11. The shift register of claim 1, wherein the first node controller further comprises:

a 1-1st transistor including a gate electrode connected to an input terminal corresponding to the first input signal, a first source/drain electrode connected to an input terminal corresponding to the second input signal, and a second source/drain electrode connected to the connection node;
a 1-2nd transistor including a gate electrode connected to an input terminal corresponding to the fourth input signal, a first source/drain electrode connected to the connection node, and a second source/drain electrode connected to a first reset power source;
a 1-3rd transistor including a gate electrode connected to an input terminal corresponding to the third input signal, a first source/drain electrode connected to an input terminal corresponding to the transistor offset voltage, and a second source/drain electrode connected to the connection node; and
a pass transistor including a bottom gate electrode, a top gate electrode, a first source/drain electrode connected to the connection node, and a second source/drain electrode connected to the first node,
wherein the pass transistor has the bottom gate electrode connected to one of the input terminal corresponding to the first input signal and the input terminal corresponding to the fourth input signal, and has the top gate electrode connected to the other of the input terminal corresponding to the first input signal and the input terminal corresponding to the fourth input signal.

12. The shift register of claim 1, further comprising a noise removing unit forming a current path between a noise discharging power source and the first node in accordance with the voltage of the second node.

13. A shift register having a plurality of stages, each of the plurality of stages comprising:
an output part outputting a scan clock signal or a gate-off voltage in accordance with a voltage of a first node and a voltage of a second node;
a first node controller controlling the voltage of the first node; and
a second node controller controlling the voltage of the second node, based on the voltage of the first node,
wherein the first node controller includes, a connection node;
a 1-1st transistor forming a current path between an input terminal corresponding to a second input signal and the connection node in response to a first input signal;
a 1-2nd transistor forming a current path between a reset power source and the connection node in response to a fourth input signal;
a 1-3rd transistor forming a current path between an input terminal corresponding to a transistor offset voltage and the connection node in response to a third input signal; and
a pass transistor including a double gate structure and forming a current path between the connection node and the first node, and
wherein the third input signal includes first to third voltage periods which are incrementally shifted, and a voltage of the connection node is shifted at three steps during the first to third voltage periods of the third input signal.

14. The shift register of claim 13, wherein the pass transistor further comprises:
a bottom gate electrode connected to one of an input terminal corresponding to the first input signal and an input terminal corresponding to the fourth input signal;

a semiconductor layer overlapping the bottom gate electrode;
a top gate electrode overlapping the semiconductor layer and connected to the other of the input terminal corresponding to the first input signal and the input terminal corresponding to the fourth input signal;
a first source/drain electrode connected to the connection node; and
a second source/drain electrode connected to the first node.

15. The shift register of claim 14, wherein the third input signal is a voltage of a first node included in an n−1st stage.

16. The shift register of claim 14, wherein
each of the first input signal and the second input signal is an output signal of an n−ith (where i is a natural number equal to or more than two) stage, and
the fourth input signal is an output signal of an n+jth (where j is a natural number equal to or more than three) stage.

17. The shift register of claim 14, wherein the third input signal is a voltage of the first node.

18. The shift register of claim 17, wherein each of the first input signal and the second input signal is an output signal of a previous stage, and
the fourth input signal is an output signal of a next stage.

19. The shift register of claim 14, further comprising a noise removing unit forming a current path between a noise discharging power source and the first node in accordance with a voltage of the second node.

20. The shift register of claim 19, wherein the noise removing unit further comprises:
a 3-1st transistor including a gate electrode connected to the second node, a first source/drain electrode connected to the first node, and a second source/drain electrode connected to a middle node;
a 3-2nd transistor including a gate electrode connected to the second node, a first source/drain electrode connected to the middle node, and a second source/drain electrode connected to the noise discharging power source; and
a 3-3rd transistor including a gate electrode connected to the first node, a first source/drain electrode connected to an input terminal corresponding to a secondary transistor offset voltage, and a second source/drain electrode connected to the middle node.

21. The shift register of claim 19, wherein the noise removing unit further comprises:
a middle node connected to the connection node;
a 3-1st transistor including a gate electrode connected to the second node, a first source/drain electrode connected to the first node, and a second source/drain electrode connected to the middle node; and
a 3-2nd transistor including a gate electrode connected to the second node, a first source/drain electrode connected to the middle node, and a second source/drain electrode connected to the noise discharging power source.

22. A display apparatus comprising:
a pixel array part including a plurality of pixels in a plurality of areas defined by a plurality of scan lines and a plurality of data lines;
a data driving circuit supplying a data signal to each of the plurality of data lines; and
a scan driving circuit supplying a scan signal to each of the plurality of scan lines,
wherein the scan driving circuit comprises a shift register having a plurality of stages, each of the plurality of stages comprising:
an output part outputting a scan clock signal or a gate-off voltage in accordance with a voltage of a first node and a voltage of a second node;
a first node controller setting the voltage of the first node in accordance with first to third input signals and a transistor offset voltage and resetting the voltage of the first node, in accordance with a fourth input signal; and
a second node controller controlling the voltage of the second node in accordance with the voltage of the first node,
wherein the first node controller includes a connection node supplied with at least one of the transistor offset voltage and the second input signal and preliminarily charged with the transistor offset voltage in accordance with the third input signal, and
wherein the third input signal includes first to third voltage periods which are incrementally shifted, and a voltage of the connection node is shifted at three steps during the first to third voltage periods of the third input signal.

23. The display apparatus of claim 22, wherein the output part further comprises:
a scan output part including a first pull-up transistor outputting the scan clock signal according to the voltage of the first node and a first pull-down transistor outputting the gate-off voltage according to the voltage of the second node; and
a carry output part including a second pull-up transistor outputting a carry clock signal according to the voltage of the first node and a second pull-down transistor outputting the gate-off voltage according to the voltage of the second node.

24. The display apparatus of claim 23, wherein the first input signal is an output signal output from a carry output part of the n−ith (where i is a natural number equal to or more than two) stage,
the second input signal is an output signal output from a scan output part or the carry output part of the n−ith stage, and
the fourth input signal is an output signal output from a scan output part of the n+jth (where j is a natural number equal to or more than three) stage.

25. The display apparatus of claim 23, wherein the output part further comprises a fourth transistor diode-connected between the first node and the second pull-up transistor.

* * * * *